US009042183B2

(12) United States Patent
Kamata et al.

(10) Patent No.: US 9,042,183 B2
(45) Date of Patent: May 26, 2015

(54) NON-VOLATILE SEMICONDUCTOR MEMORY DEVICE HAVING NON-VOLATILE MEMORY ARRAY

(71) Applicant: Kabushiki Kaisha Toshiba, Minato-ku (JP)

(72) Inventors: Yoshihiko Kamata, Kanagawa-ken (JP); Koji Tabata, Kanagawa-ken (JP); Tomoyuki Hamano, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/020,246

(22) Filed: Sep. 6, 2013

(65) Prior Publication Data
US 2014/0286104 A1 Sep. 25, 2014

(30) Foreign Application Priority Data
Mar. 21, 2013 (JP) .................................. 2013-059144

(51) Int. Cl.
G11C 16/06 (2006.01)
G11C 16/26 (2006.01)

(52) U.S. Cl.
CPC ...................................... G11C 16/26 (2013.01)

(58) Field of Classification Search
USPC ........................... 365/185.21, 185.22, 185.28
See application file for complete search history.

(56) References Cited

U.S. PATENT DOCUMENTS

| | | | |
|---|---|---|---|
| 6,643,188 B2 | 11/2003 | Tanaka et al. | |
| 7,852,675 B2 | 12/2010 | Maejima | |
| 8,372,720 B2 | 2/2013 | Fukuzumi et al. | |
| 2006/0050564 A1* | 3/2006 | Kojima et al. | 365/185.22 |
| 2008/0094903 A1 | 4/2008 | Maejima et al. | |
| 2009/0267128 A1 | 10/2009 | Maejima | |
| 2010/0008157 A1* | 1/2010 | Honma | 365/189.05 |
| 2010/0214837 A1 | 8/2010 | Sako et al. | |
| 2010/0322012 A1 | 12/2010 | Suzuki et al. | |
| 2011/0284946 A1 | 11/2011 | Kiyotoshi | |
| 2013/0100744 A1* | 4/2013 | She et al. | 365/185.21 |

FOREIGN PATENT DOCUMENTS

| | | |
|---|---|---|
| JP | 2008-103003 | 5/2008 |
| JP | 2010-198698 | 9/2010 |
| JP | 2011-8838 | 1/2011 |

\* cited by examiner

*Primary Examiner* — Hoai V Ho
(74) *Attorney, Agent, or Firm* — Oblon, McClelland, Maier & Neustadt, L.L.P.

(57) ABSTRACT

According to one embodiment, a non-volatile semiconductor memory device which is provided with a memory cell array, bit lines, word lines, and a sense amplifier circuit is presented. The memory cell array includes memory cells. The bit lines are electrically connected to the memory cells. The word lines are electrically connected to gates of the non-volatile memory cells. The sense amplifier circuit includes sense amplifiers which are electrically connected to the bit lines. Each of the sense amplifiers includes a latch circuit which is capable of holding data, and a detection circuit. The sense amplifiers are configured to apply any one of a first voltage and a second voltage higher than the first voltage to the bit lines respectively. The sense amplifiers apply any one of the first voltage and the second voltage s a third voltage to the bit lines, and apply the third voltage to the detection circuit.

14 Claims, 21 Drawing Sheets

US 9,042,183 B2

NON-VOLATILE SEMICONDUCTOR MEMORY DEVICE HAVING NON-VOLATILE MEMORY ARRAY

CROSS-REFERENCE TO RELATED APPLICATION

This application is based upon and claims the benefit of priority from the prior Japanese Patent Application No. 2013-59144, filed on Mar. 21, 2013, the entire contents of which are incorporated herein by reference.

FIELD

Embodiments described herein relate generally to a non-volatile semiconductor memory device.

BACKGROUND

A NAND flash memory is provided with memory cells arranged in a matrix, sense amplifiers capable of holding data to be written to the memory cells, etc.

As to a NAND flash memory, high-speed write operation is desired.

BRIEF DESCRIPTION OF THE DRAWINGS

FIG. 7A shows writing states of respective bit lines, FIG. 7B is a time chart of voltage levels of the signals which arise in the modification;

FIG. 8A shows a current flowing in a sense amplifier during the write operation, FIG. 8B is a time chart of signals which arise in the sense amplifier;

FIGS. 9A to 15B are diagrams for explaining a write operation of a non-volatile semiconductor memory device according to a second embodiment, FIGS. 9A to 15A are circuit diagrams showing a sense amplifier provided in the non-volatile semiconductor memory device, FIGS. 9B to 15B show voltage levels of nodes arranged in the sense amplifier;

FIGS. 17A to 20B are diagrams for explaining a write operation of a non-volatile semiconductor memory device according to a modification of the second embodiment, FIGS. 17A to 20A are circuit diagrams showing a sense amplifier provided in the non-volatile semiconductor memory device, FIGS. 17B to 20B show voltage levels of nodes arranged in the sense amplifier.

DETAILED DESCRIPTION

Figure 1:
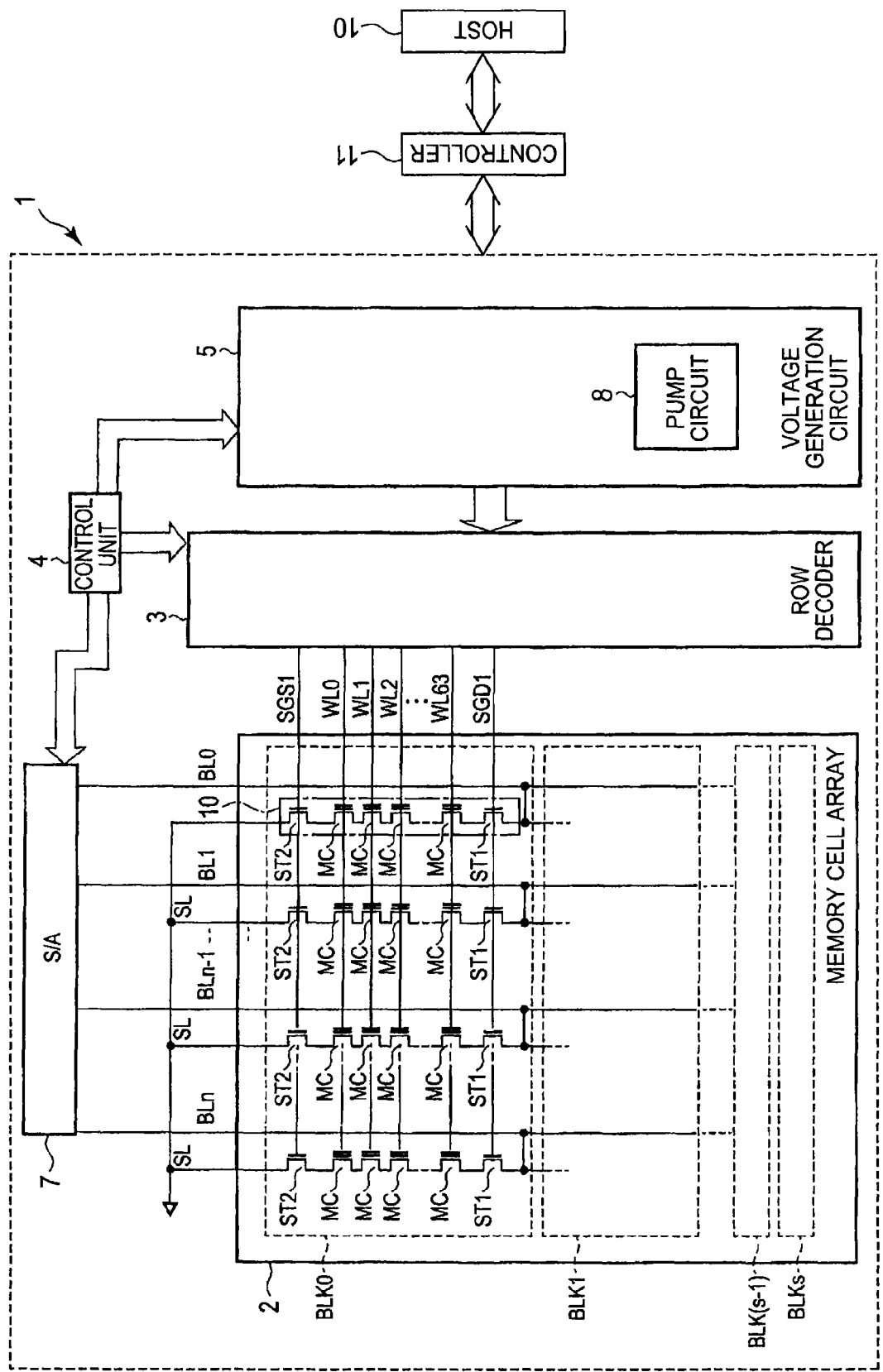
FIG. 1 is a diagram showing an overall configuration of a non-volatile semiconductor memory device according to a first embodiment.

According to one embodiment, a non-volatile semiconductor memory device which is provided with a memory cell array, bit lines, word lines, and a sense amplifier circuit is presented.

The memory cell array includes memory cells. The bit lines are electrically connected to the memory cells. The word lines are electrically connected to gates of the non-volatile memory cells. The sense amplifier circuit includes sense amplifiers which are electrically connected to the bit lines. Each of the sense amplifiers includes a latch circuit which is capable of holding data, and a detection circuit. Further, the sense amplifiers are configured to apply any one of a first voltage and a second voltage higher than the first voltage to the bit lines respectively. The sense amplifiers apply any one of the first voltage and the second voltage as a third voltage to the bit lines, and apply the third voltage to the detection circuit.

Hereinafter, further embodiments will be described with reference to the drawings. In the drawings, the same reference numerals denote the same or similar portions respectively.

A non-volatile semiconductor memory device according to a first embodiment performs a write operation and transfers a verify result to a detection circuit at the same time, by utilizing that a voltage level to be transferred to a bit line BL and a voltage level (verify result) to be transferred to the detection circuit are the same, in a write operation. Hereinafter, "transfer voltage (level)" includes the meaning of "apply voltage (level)".

Specifically, during a non-write operation, a voltage VDDSA is transferred to the bit line, and the voltage VDDSA is transferred to the detection circuit as well. The voltage VDDSA to be transferred to the detection circuit may be referred to as a level "H (High)", below.

On the other hand, during writing operation, 0 V is transferred to the bit line, and 0 V is likewise transferred to the detection circuit as well. The voltage 0 V to be transferred to the detection circuit may be referred to as the level "L (Low)", below. 0 V is a first voltage, and the voltage VDDSA is a second voltage higher than the first voltage. The voltage to be transferred to the bit line (0 V or the voltage VDDSA) is a third voltage.

The first embodiment will be described with reference to FIG. 1. FIG. 1 is a diagram showing the overall configuration of a semiconductor device according to the first embodiment. In the following description, "connect to an element" means "connect to an element via another element" as well as "connect to an element directly."

1. Overall Configuration

The semiconductor device of the first embodiment is a NAND flash memory.

The non-volatile semiconductor memory device 1 is provided with a memory cell array 2, a row decoder 3, a controller 4, a voltage generation circuit 5, and a sense amplifier circuit 7.

1.1<Configuration of Memory Cell Array>

The memory cell array 2 is provided with blocks BLK0 to BLKs. Each of the blocks includes non-volatile memory cells MC. "s" is a natural number. Each of the blocks BLK0 to BLKs includes NAND strings 10. In each of the NAND strings 10, a number of pieces of the non-volatile memory cells MC are connected in series. For example, each NAND string 10 includes 64 pieces of the memory cells MC, and select transistors ST1, ST2.

Each memory cell MC is capable of holding data of two or more values. Each memory cell MC may be an FG structure including a floating gate (charge accumulation layer), control gate, and a p-type semiconductor substrate having a source and a drain formed apart from each other. The floating gate is formed on a p-type semiconductor substrate via a gate insulating film. The control gate is formed on the floating gate via an inter-gate insulating film. Each memory cell MC may be a MONOS structure. A MONOS memory cell includes a charge accumulation layer i.e. an insulating film, an insulating film (hereinafter, referred to as a block layer), and a control gate formed on the block layer. The charge accumulation layer is formed on a semiconductor substrate via a gate insulating film. The block layer is formed on the charge accumulation layer and having higher permittivity than the charge accumulation layer.

The control gates of the memory cells MC are electrically connected to word lines WL0 to WL63 respectively of the memory cells MC are electrically connected to bit lines BL0 to BLn. "n" is a natural number. The sources of the memory cells MC are electrically connected to source lines SL. Each memory cell MC is an n-channel MOS transistor. The number of memory cells MC is not limited to 64 but may be 128, 256, or 512, and the number is not limited.

Each memory cell MC shares a source and a drain with the adjacent memory cells MC. Current paths of the memory cells MC in each NAND string are arranged in such a way as to be connected in series between the corresponding pair of select transistors ST1, ST2. The drain of one of the series-connected memory cells MC located at one end of each NAND string is connected to the source of the corresponding select transistor ST1. The source of one of the series-connected memory cells MC located at the other end of each NAND string is connected to the drain of the corresponding select transistor ST2.

The control gates of the memory cells MC arranged in the same row are connected in common to one of the word lines WL0 to WL63. The gate electrodes of the select transistors ST1 arranged in the same row are connected in common to a select gate line SGD1. The gate electrodes of the select transistors ST2 arranged in the same row are connected in common to a select gate line SGS1. In the following, for describing simply, the word lines WL0 to WL63 will be referred to as word line(s) WL simply, when they do not need to be distinguished from one another. The drains of the select transistors ST1 arranged in the same column in the memory cell array 2 are connected in common to one of the bit lines BL0 to BLn. In the following, the bit lines BL0 to BLn will be referred to as bit line(s) BL simply, when they do not need to be distinguished from one another. The sources of the select transistors ST2 are connected in common to one of the source lines SL.

Data writing is performed collectively on the memory cells MC connected to the same word line WL, and this unit of write operation is called a page. Further, data erasing is performed collectively on the memory cells MC in the block BLK.

The configuration of the memory cell array 2 is not limited to the above configuration, and is described, for example, in U.S. patent application Ser. No. 12/407,403 filed on Mar. 19, 2009 and entitled "THREE DIMENSIONAL STACKED NONVOLATILE SEMICONDUCTOR MEMORY" Further, the configuration may be any one of the configurations described in U.S. patent application Ser. No. 12/406,524 filed on Mar. 18, 2009 and entitled "THREE DIMENSIONAL STACKED NONVOLATILE SEMICONDUCTOR MEMORY," U.S. patent application Ser. No. 12/679,991 filed on Mar. 25, 2010 and entitled "NON-VOLATILE SEMICONDUCTOR MEMORY DEVICE AND METHOD OF MANUFACTURING THE SAME," and U.S. patent application Ser. No. 12/532,030 filed on Mar. 23, 2009 and entitled "SEMICONDUCTOR MEMORY AND METHOD FOR MANUFACTURING SAME." The entire contents of these patent applications are incorporated herein by reference.

1.2 <Configuration of Peripheral Circuit>

In FIG. 1, the row decoder 3 is connected to the word lines WL and selects and drives the word lines WL during data reading, writing, and erasing.

The controller 4 generates a control signal which controls a sequence of data writing and data erasing, and another control signal which controls data reading, by a command signal input through a controller 11 on the basis of an external control signal and a command CMD provided from a host 10 in accordance with an operating mode. The control signals are sent to the row decoder 3, the voltage generation circuit 5 and the sense amplifier circuit 7. When specific commands are provided to the controller 11 from the host 10 or from the controller 11, various sequences of data reading and data writing described below can be performed in the non-volatile semiconductor memory device 1.

The controller 4 is not always arranged in the non-volatile semiconductor memory device 1. The controller 4 may be arranged in a semiconductor device other than the non-volatile semiconductor memory device 1, or may be arranged in the host.

The voltage generation circuit 5 is provided with a pump circuit 8 described below generates read voltages VREAD, VCGR, a write voltage VPGM, verify voltages VL, VH, an erase voltage VERA, and voltages necessary for various operations of the memory cell array 2, the row decoder 3 and the sense amplifier circuit 7, for example, voltages VWPCH, VDDSA, VSEVEN and VHSA, in accordance with the control signals sent from the controller 4. The voltage VWPCH is a voltage which is produced by a pump circuit provided in a chip for the purpose of raising an internal voltage VDD described below. The voltage VDDSA is a source voltage for latching data of sense amplifiers described below constituting the sense amplifier circuit 7. The voltage VHSA is a source voltage for use as a cell current source of the sense amplifiers of the sense amplifier circuit 7.

The sense amplifier circuit 7 is connected to each of the bit lines BL and is provided with sense amplifiers. A representative one of the sense amplifiers i.e. a sense amplifier 6 will be explained below with reference to FIG. 3. The sense amplifiers may be called as a page buffer. The sense amplifier circuit 7 controls bit line voltages during data reading, writing, and erasing. During data reading, the sense amplifier circuit 7 detects data of the bit lines BL. Further, during data writing, the sense amplifier circuit 7 applies voltages to the bit lines BL, the voltages corresponding to write data.

1.3 <Threshold Distribution>

The threshold distributions of the memory cells MC, and the verify voltages VL, VH will be described with reference to FIG. 2. The verify voltages are voltages for checking conduction and non-conduction of each NAND string 10 to check whether desired data is written or not.

Each memory cell MC is capable of storing one of two values of data "0" and "1," for example. As shown in FIG. 2, these two values are a level "E" and a level "A" which are lower in this order. The level "E" indicates an erased state in which charges are not accumulated in the charge accumulation layer. As charges accumulate in the charge accumulation layer, the voltage rises from the level "E" toward the level "A."

Figure 2:
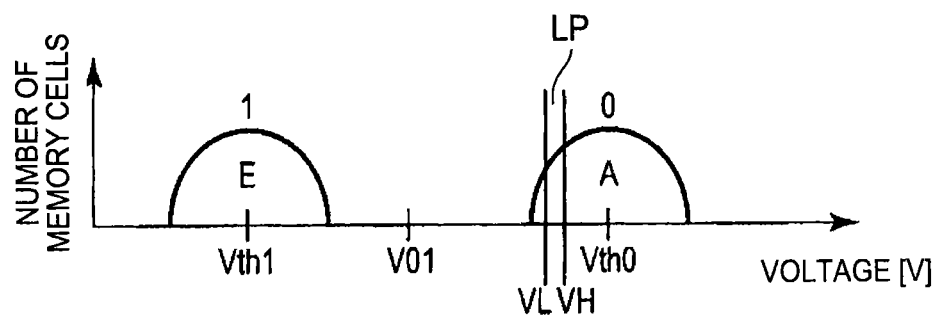
FIG. 2 is a diagram showing threshold distributions of memory cells provided in the non-volatile semiconductor memory device.

As shown in FIG. 2, the verify voltage VL is a voltage between a voltage V01 and the voltage VH, and satisfies a relation of V01<voltage VL <VH.

The voltage VL represents a verify point. For the memory cells belonging to a threshold distribution below the voltage VL, a normal write (bit line BL=0 V) needs to be performed. The voltage VL is a voltage for determining whether a high voltage i.e. a voltage V1 needs to be applied to the bit line BL and the word lines WL.

Further, the verify voltage VH is a voltage between the voltages VL, Vth0, and satisfies a relation of VL<voltage VH<Vth0.

The voltage VH is a verify point for determining whether to perform a further writing or to terminate writing.

Specifically, in the case where the threshold distribution of the memory cells MC exceeds the voltage VH, it is determined that the thresholds of the memory cells MC are sufficiently raised so that additional writing is not performed.

On the other hand, in the case where the threshold distribution of the memory cells MC is equal to or larger than the voltage VL and equal to or smaller than the voltage VH, it is necessary to perform a weak writing on the memory cells MC. The voltage VH is a voltage for determining whether a voltage V2 lower than the voltage V1 needs to be applied between the word lines WL and the bit line BL. This writing method is called a Quick Pass Write (hereinafter, referred to as "QPW") method.

The QPW method is described in U.S. patent application Ser. No. 10/051,372 filed on Jan. 22, 2002 and entitled "NONVOLATILE SEMICONDUCTOR MEMORY DEVICE," for example. The entire content of this patent application is incorporated herein by reference.

2. <Configuration of Sense Amplifier>

The configuration of the sense amplifier 6 forming the sense amplifier circuit 7 will be described with reference to FIG. 3. The sense amplifier 6 is provided with a sensing portion 6a having a latch circuit SDL described below, a data latch circuit XDL for caching, and a detection circuit DTCT. The data latch circuit XDL is arranged for each corresponding sensing portion 6a. The data latch circuit XDL is a latch circuit which holds data when transfer of data such as data-in or data-out is performed with outside of a chip containing the non-volatile semiconductor memory device 1 via a chip interface (a data input and output circuit). The detection circuit DTCT is arranged for each 16 sensing portions 6a. In the following, the configurations of the sensing portion 6a, the data latch circuit XDL and the detection circuit DTCT will be described separately.

The controller 4 controls the voltage levels of signals to be provided to the gates of the MOS transistors mentioned above which compose the non-volatile semiconductor memory device 1. Further, the controller 4 controls the timings for providing the signals. The voltage generation circuit 5 generates the voltage levels of the signals.

In the following, the threshold potential of each MOS transistor will be shown by attaching a reference numeral of the MOS transistor to "Vth" that indicates the threshold potential of the MOS transistor. For example, the threshold potential of a MOS transistor 22 will be shown as Vth22.

2.1 <Configuration of Sensing Portion 6a>

The sensing portion 6a is provide with n-channel MOS transistors 20 to 23, 25, 28 to 37, 39 to 41, 46 to 48, p-channel MOS transistors 38, 42 to 45, 49, and a capacitor element 27.

One end of the current path of the MOS transistor 20 is connected to the corresponding bit line BL while the other end of the current path of the MOS transistor 20 is connected to a node N1, and a signal BLS is provided to the gate of the MOS transistor 20. The signal BLS is a signal which is set to a level "H (High)" during a read operation and a write operation to allow connection between the bit line BL and the sense amplifier 6.

One end of the current path of the MOS transistor 21 is connected to the node N1 while the other end of the current path of the MOS transistor 21 is set to a ground voltage (voltage VLSA), and a signal BLV is provided to the gate of the MOS transistor 21.

One end of the current path of the MOS transistor 22 is connected to the node N1 while the other end of the current path of the MOS transistor 22 is connected to a node SCOM, and a signal BLC is provided to the gate of the MOS transistor 22. The signal BLC is a signal for clamping the bit line BL at a predetermined potential. For instance, when, for example, the signal BLC=(Vblc+Vth22) is given to the MOS transistor 22, a voltage Vblc is transferred to the bit line BL.

The signal BLC is equal to (VQPW+Vth22) when the threshold distribution of the memory cells MC belonging to a region LP in FIG. 2 is narrowed in writing in this embodiment.

One end of the current path of the MOS transistor 23 is connected to the node SCOM, the voltage VHSA (=internal voltage VDD) is supplied to the other end of the current path of the MOS transistor 23, and a signal BLX (voltage (Vblc+Vth23+BLC2BLX)) is supplied to the gate of the MOS transistor 23. The internal voltage VDD is produced in the chip based on an outside voltage VCC.

Thus, the potential of the node SCOM during precharging is a voltage (Vblc+BLC2BLX).

The voltage BLC2BLX is a guard band voltage for securely transferring the voltage VHSA to the node SCOM, and is a voltage for raising the current driving force of the MOS transistor 23 beyond that of the MOS transistor 22. For example, in the case where a signal BLX<a signal BLC, the voltage to be supplied to the bit line BL is lowered to the signal BLX. In order to prevent such a situation, the voltage of the single BLX is set to a voltage higher than the voltage BLC.

One end of the current path of the MOS transistor 25 is connected to the node SCOM while the other end of the current path of the MOS transistor 25 is connected to a node SEN (sensing portion), and a signal XXL (Vlbc+Vth25+BLC2BLX+BLX2XXL) is supplied to the gate of the MOS transistor 25. The node SEN may be called as a sense capacitor which detects on/off of the memory cells. A voltage higher than that of the MOS transistor 23 by the amount of the voltage BLX2XXL is supplied to the gate of the MOS transistor 25. The voltage BLX2XXL is a guard band voltage for transferring charges accumulated in the node SEN to the node SCOM.

The signals BLC, BLX, XXL satisfy a relation of the signal BLC<the signal BLX<the signal XXL in terms of voltage. Specifically, the current driving force of the MOS transistor 25 is larger than that of the MOS transistor 23. These current driving forces are set in the above manner because, when data "1" is to be sensed, the current which the MOS transistor 25 flows is set larger than the current which the MOS transistor 23 flows so the current from the node SEN is caused to flow to the bit line BL in priority.

Figure 3:
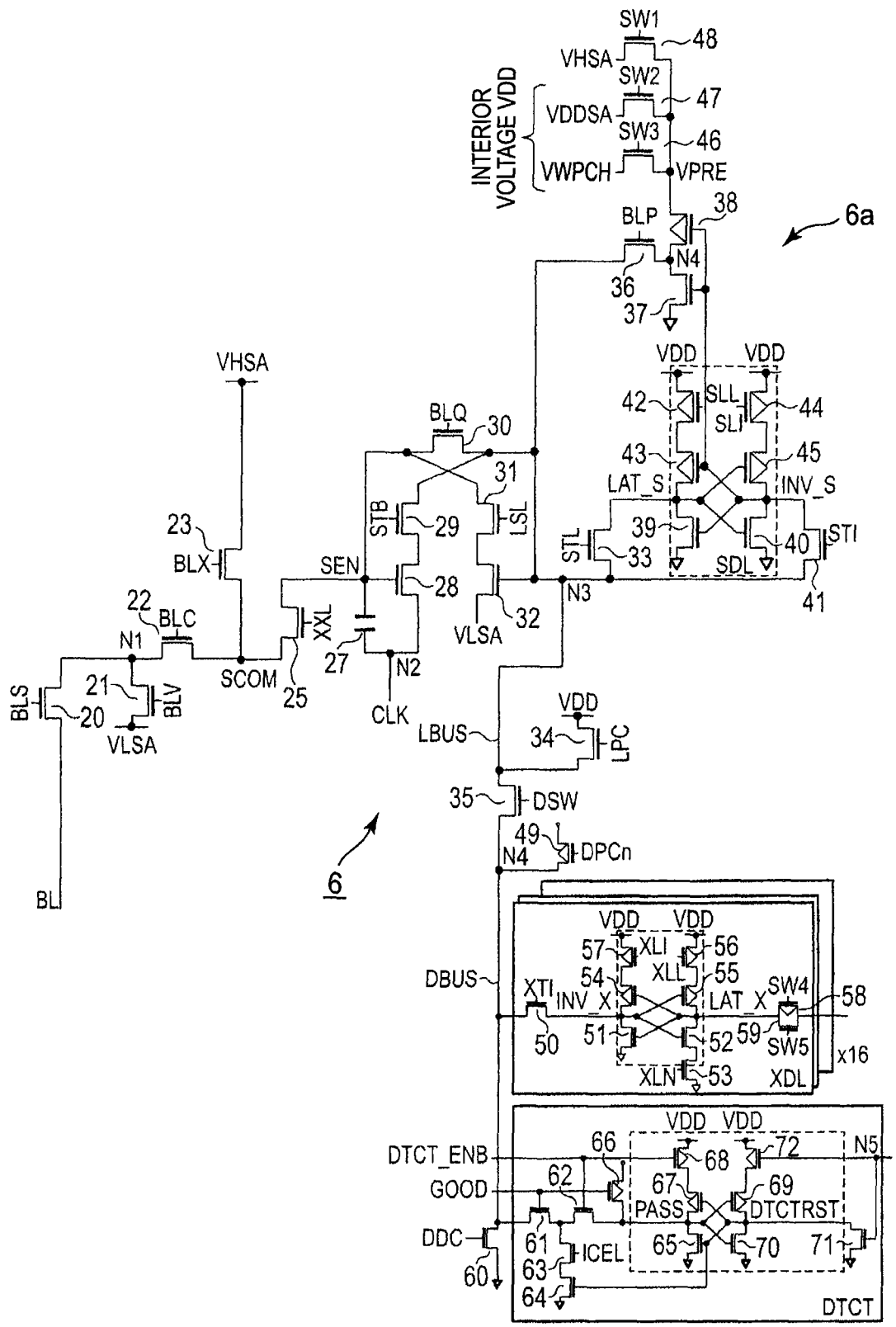
FIG. 3 is a circuit diagram of a sense amplifier provided in the non-volatile semiconductor memory device.

In FIG. 3, a clock signal CLK (=voltage (Vblc+BLC2BLX)) is provided to one electrode of the capacitor element 27 through a node N2, and the other electrode of the capacitor element 27 is connected to the node SEN. The clock signal CLK has a function for boosting the potential of the node SEN.

One end of the current path of the MOS transistor 28 is connected to the node N2, and a signal SEN is provided to the gate of the MOS transistor 28. The MOS transistor 28 is turned on and off according to the potential of the node SEN.

One end of the current path of the MOS transistor 29 is connected to the other end of the MOS transistor 28 while the other end of the current path of the MOS transistor 29 is connected to a node N3, and a signal STB is provided to the gate of the MOS transistor 29.

One end of the current path of the MOS transistor 30 is connected to the node SEN while the other end of the current path of the MOS transistor 30 is connected to the node N3, and a signal BLQ (=voltage (VDD+Vth30+Vα)) is supplied to the gate of the MOS transistor 30. The voltage Vα is a voltage i.e. a guard band voltage added to transfer a voltage VDD to the node SEN securely. The voltage VDD is transferred from the MOS transistor 34.

One end of the current path of the MOS transistor 31 is connected to the node SEN, and a signal LSL is provided to the gate of the MOS transistor 31. One end of the current path of the MOS transistor 32 is connected to the other end of the current path of the MOS transistor 31 while the other end of the current path of the MOS transistor 32 is set to the ground voltage (voltage VLSA), and the gate of the MOS transistor 32 is connected to the node N3. The MOS transistors 31, 32 are transistors for calculating data.

One end of the current path of the MOS transistor 33 is connected to the node N3 while the other end of the current path of the MOS transistor 33 is connected to a node LAT_S, and a signal STL is provided to the gate of the MOS transistor 33.

One end of the current path of the MOS transistor 35 is connected to the node N3. The other end of the current path of the MOS transistor 35 is connected to a wiring DBUS through a node N4 and is set to a ground potential when necessary. A signal DSW is provided to the gate of the MOS transistor 35.

The voltage VDD is supplied to one end of the current path of the MOS transistor 34, the other end of the current path of the MOS transistor 34 is connected to the node N3, and a signal LPC is provided to the gate of the MOS transistor 34. The node N3 is connected to a wiring LBUS, and the MOS transistor 34 charges the node SEN through the wiring LBUS.

One end of the current path of the MOS transistor 38 is connected to a node VPRE while the other end of the current path of the MOS transistor 38 is connected to the node N4, and the signal of a node INV_S is provided to the gate of the MOS transistor 38. One end of the current path of the MOS transistor 37 is connected to the node N4 while the other end of the current path of the MOS transistor 37 is grounded, and the signal of the node INV_S is provided to the gate of the MOS transistor 37. One end of the current path of the MOS transistor 36 is connected to the node N4 while the other end of the current path of the MOS transistor 36 is connected to the node SCOM, and a signal BLP is provided to the gate of the MOS transistor 36.

The MOS transistors 36 to 38 are a group of transistors for transferring the following voltage to the bit line BL. The MOS transistors 36 to 38 have a function of transferring 0 V, the voltage VDDSA, the voltage VWPCH, or the voltage VHSA to the node SCOM, for example, in accordance with write data stored in the latch circuit SDL.

One end of the current path of the MOS transistor 39 is connected to the node LAT_S while the other end of the current path of the MOS transistor 39 is grounded, and the signal of the node INV_S is provided to the gate of the MOS transistor 39. The data of the node SEN is stored in the latch circuit SDL through the MOS transistor 39.

One end of the current path of the MOS transistor 40 is connected to the node INV_S while the other end of the current path of the MOS transistor 40 is grounded, and the gate of the MOS transistor 40 is connected to the node LAT_S.

One end of the current path of the MOS transistor 41 is connected to the node INV_S while the other end of the current path of the MOS transistor 41 is connected to the node N3, and a signal STI is provided to the gate of the MOS transistor 41.

The voltage VDD is supplied to one end of the current path of the MOS transistor 42, and a signal SLL is provided to the gate of the MOS transistor 42.

One end of the current path of the MOS transistor 43 is connected to the other end of the current path of the MOS transistor 42 while the other end of the current path of the MOS transistor 43 is connected to the node LAT_S, and the gate of the MOS transistor 43 is connected to the node INV_S.

The voltage VDD is supplied to one end of the current path of the MOS transistor 44, and a signal SLI is provided to the gate of the MOS transistor 44.

One end of the current path of the MOS transistor 45 is connected to the other end of the current path of the MOS transistor 44 while the other end of the current path of the MOS transistor 45 is connected to the node INV_S, and the gate of the MOS transistor 45 is connected to the node LAT_S.

The MOS transistors 39, 40, 43 and 45 form the latch circuit SDL, and the latch circuit SDL holds the data of the node LAT_S. For example, in the case of writing "1," the latch circuit SDL holds a level "H" (=data "1").

On the other hand, in the case of writing "0," the latch circuit SDL holds a level "L" (=data "0").

Further, one end of the current path of each of the MOS transistors 46 to 48 is connected to the other end of the current path of the MOS transistor 38.

The voltage VWPCH (>VDD) is supplied to the other end of the current path of the MOS transistor 46, and a switch signal SW3 is provided to the gate of the MOS transistor 46.

The voltage VDDSA (=VDD) is supplied to the other end of the current path of the MOS transistor 47, and a switch signal SW2 is provided to the gate of the MOS transistor 47.

The voltage VHSA (>VWPCH) is supplied to the other end of the current path of the MOS transistor 48, and a switch signal SW1 is provided to the gate of the MOS transistor 48.

The voltage VWPCH is a voltage obtained by raising the a voltage obtained by raising the internal voltage VDD. The voltage VHSA is a voltage obtained by lowering a voltage VCC (>voltage VDD) in the case where the voltage VCC is supplied as the internal VOLTAGE.

Further, one end of the current path of the MOS transistor 49 is connected to the node N3, the voltage VDD is supplied to the other end of the current path of the MOS transistor 49, and a signals DPCn is provided to the gate of the MOS transistor 49. The MOS transistor 49 is turned on at each data transfer from the node SEN to the data latch circuit XDL, and has a function of charging the wiring DBUS.

2.2 <Configuration of Data Latch Circuit XDL>

The data latch circuit XDL is provide with n-channel MOS transistors 50 to 53, 59 and p-channel MOS transistors 54 to 58.

One end of the current path of the MOS transistor 50 is connected to the node N3 while the other end of the current path of the MOS transistor 50 is connected to a node INV_X, and a signal XTI is provided to the gate of the MOS transistor 50.

One end of the current path of the MOS transistor 51 is connected to the node INV_X while the other end of the current path of the MOS transistor 51 is grounded, and the gate of the MOS transistor 51 is connected to a node LAT_X.

One end of the current path of the MOS transistor 54 is connected to the node INV_X, and the gate of the MOS transistor 54 is connected to the node LAT_X.

One end of the current path of the MOS transistor 52 is connected to the node LAT_X, and the gate of the MOS transistor 52 is connected to the node INV_X.

Further, one end of the current path of the MOS transistor 53 is connected to the other end of the current path of the MOS transistor 52 while the other end of the current path of the MOS transistor 53 is grounded, and a signal XLN is provided to the gate of the MOS transistor 53.

One end of the current path of the MOS transistor 55 is connected to the node LAT_X, and the gate of the MOS transistor 55 is connected to the node INV_X.

The voltage VDD is supplied to one end of the current path of the MOS transistor 57, the other end of the current path of the MOS transistor 57 is connected to the other end of the current path of the MOS transistor 54, and a signal XLI is provided to the gate of the MOS transistor 57.

The VDD is supplied to one end of the current path of the MOS transistor 56, the other end of the current path of the MOS transistor 56 is connected to the other end of the current path of the MOS transistor 55, and a signal XLL is provided to the gate of the MOS transistor 56.

The MOS transistors 51, 52, 54 and 55 form the data latch circuit XDL. Data to be held in the data latch circuit XDL is determined by the voltage level of the node LAT_X.

Further, one end of the current path of the MOS transistor 58 is connected to the node LAT_X, a switch signal SW4 is provided to the gate of the MOS transistor 58, and the other end of the current path of the MOS transistor 58 is connected to the data input and output circuit (not shown) via a node in common with the adjacent page buffer which is one of the sense amplifiers 6.

One end of the current path of the MOS transistor 59 is also connected to the node LAT_X, a switch signal SW5 is provided to the gate of the MOS transistor 59, and the other end of the current path of the MOS transistor 59 is connected to the data input and output circuit mentioned above.

The switch signal SW4 is an inverted signal of the switch signal SW5. For example, in the case where the switch signal SW4 is at a level "H," the switch signal SW5 is at a level "L." The MOS transistors 58, 59 function as a switch which receives data from the data input and output circuit or outputs data to the data input and output circuit.

2.3 <Configuration of Detection Circuit DTCT>

The detection circuit DTCT includes n-channel MOS transistors 61 to 65, 70 and 71 and p-channel MOS transistors 66 to 69. The detection circuit DTCT detects pass/fail of a verify result.

One end of the current path of the MOS transistor 61 is connected to the node N4, and a signal GOOD is provided to the gate of the MOS transistor 61. The signal GOOD is a signal indicating whether or not a column of the memory cells MC of the sense amplifier 6 is a bad column. In a case where operation of the sense amplifier 6 is directed to a bad column (a bit line), the signal GOOD is set to a level "L (Low)." In a case where operation of the sense amplifier 6 is directed to a good bit line BL as a first bit line does not indicate disconnection, for example, the signal GOOD is set to a level "H (High)." The bit line constituting the bad column which indicates disconnection, for example, is a second bit line.

One end of the current path of the MOS transistor 62 is connected to the other end of the current path of the MOS transistor 61, and a signal DTCT_ENB is provided to the gate of the MOS transistor 62.

One end of the current path of the MOS transistor 63 is connected to the other end of the current path of the MOS transistor 61 and the one end of the current path of the MOS transistor 62, and a signal ICEL is provided to the gate of the MOS transistor 63.

One end of the current path of the MOS transistor 64 is connected to the other end of the current path of the MOS transistor 63, the gate of the MOS transistor 64 is connected to the gate of the MOS transistor 65, and the other end of the current path of the MOS transistor 64 is grounded.

One end of the current path of the MOS transistor 65 is connected to a node PASS while the other end of the current path of the MOS transistor 65 is grounded, and the gate of the MOS transistor 65 is connected to a node DTCTRST.

One end of the current path of the MOS transistor 67 is connected to the node PASS, and the gate of the MOS transistor 67 is connected to the node DTCTRST.

The voltage VDD is supplied to one end of the current path of the MOS transistor 68, the other end of the current path of the MOS transistor 68 is connected to the other end of the current path of the MOS transistor 67, and the signal DTCT_ENB is provided to the gate of the MOS transistor 68.

One end of the current path of the MOS transistor 70 is connected to the node DTCTRST while the other end of the current path of the MOS transistor 70 is grounded, and the gate of the MOS transistor 70 is connected to the node PASS.

One end of the current path of the MOS transistor 69 is connected to the node DTCTRST, and the gate of the MOS transistor 69 is connected to the node PASS.

Further, the voltage VDD is supplied to one end of the current path of the MOS transistor 72, the other end of the current path of the MOS transistor 72 is connected to the other end of the current path of the MOS transistor 69, and the gate of the MOS transistor 72 and the gate of the MOS transistor 71 are connected in common to a node N5.

A reset signal DTCTRST is provided to the node N5 from the controller 4 in FIG. 1. The potential of the node N5 is set to a level "H" at the time of resetting the potential of the node DTCTRST.

One end of the current path of the MOS transistor 71 is connected to the node DTCTRST while the other end of the current path of the MOS transistor 71 is grounded.

The detection circuit DTCT is electrically grounded through the MOS transistor 60. One end of the current path of the MOS transistor 61 is connected to the node N3 while the other end of the current path of the MOS transistor 60 is grounded, and a signal DDC to be controlled by an sequencer (not shown) is provided to the gate of the MOS transistor 60.

3. <Configuration of Pump Circuit>

Figure 4:
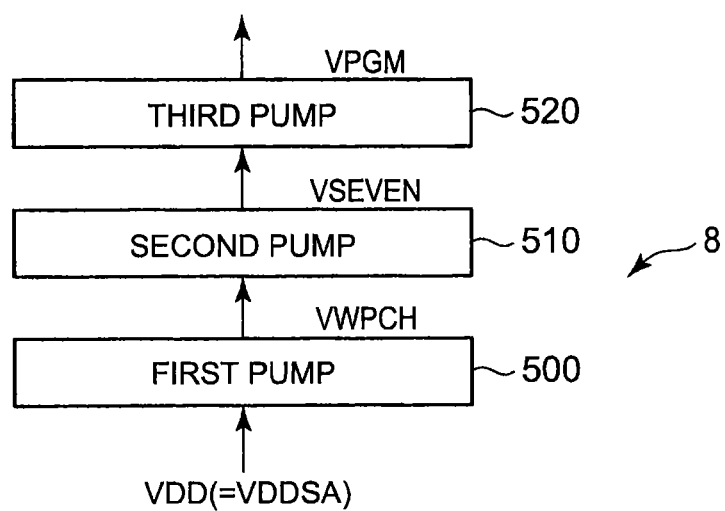
FIG. 4 is a diagram showing a configuration of a pump circuit arranged in a voltage generation circuit of the non-volatile semiconductor memory device.

As shown in FIG. 4, the pump circuit 8 provided in the voltage generation circuit 5 shown in FIG. 1 is provided with a first pump circuit 500, a second pump circuit 510, and a third pump circuit 520. The pump circuit 8 does not need to be driven in the case where a voltage VCC is supplied from outside. This is because a desired high voltage such as the voltage VHSA mentioned above can be obtained by lowering the voltage VCC.

The pump circuit 8 is driven when it is supplied with the internal voltage VDD from outside.

The first pump circuit 500 receives the internal voltage VDD and generates the voltage VWPCH. As mentioned above, the first pump circuit 500 supplies the voltage VWPCH to the other end of the current path of the MOS transistor 46. The voltage VWPCH is a voltage to be transferred to the bit line BL in a verify operation and a non-write operation. A case where the voltage VWPCH is transferred to the bit line BL will be described in explaining a modification of the embodiment below.

The second pump circuit 510 receives the voltage VWPCH and generates the voltage VSEVEN. The third pump circuit 520 receives the voltage VSEVEN and generates the voltage VPGM. As mentioned above, the voltage VPGM is a voltage to be transferred to each selected word line WL during writing.

4. <Outline of Write Operation>

Figure 5:
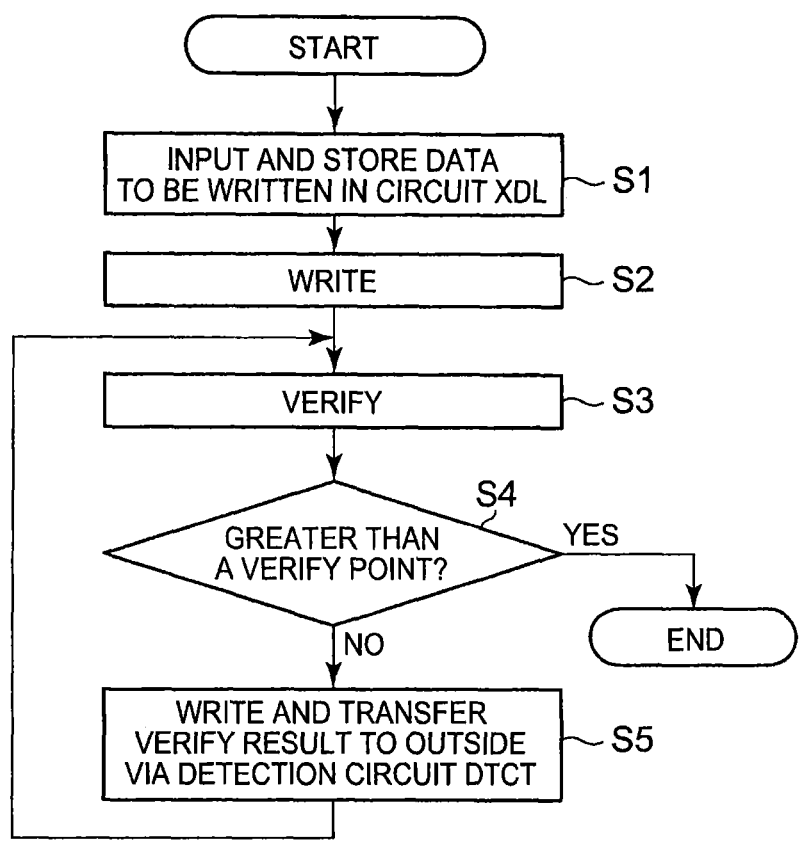
FIG. 5 is a flowchart showing a write operation of the non-volatile semiconductor memory device schematically.

A write operation will be described with reference to FIG. 5. The write operation is controlled by the controller 4 in FIG. 1. Write data is inputted from outside and stored in the data latch circuit XDL (step S1). Then the write data is transferred from the data latch circuit XDL to the latch circuit SDL, and subsequently a write operation is executed (step S2). By the execution of the write operation, writing of the write data stored in the latch circuit SDL is carried out for each memory cells MC. Specifically, writing is executed by transferring one of 0 V or the voltage VDDSA to the bit line BL and by transferring a predetermined voltage to each word line WL.

After the writing, a verify operation for checking whether the write data is correctly written to each memory cell MC is executed (step S3). The verify operation is performed by supplying a predetermined voltage to the bit line BL and by transferring the verify voltage VH (or the voltage VL) or the voltage VREAD to each word line WL.

As a result, whether the data is correctly written is checked based on whether each NAND string 10 is conductive or not. In the case where the memory cell MC from which data is read by the verify operation is in an on state and the corresponding NAND string 10 is made conductive, it is determined that the above writing is not performed sufficiently. On the other hand, in the case where the memory cell MC from which data is read by the verify operation is in an off state, the corresponding NAND string 10 is made non-conductive, it is determined that the writing is performed sufficiently.

In a case where the threshold voltage of the memory cell MC exceeds the verify voltage VH (or the voltage VL) i.e. in a case of "YES" in step S4, the write operation is terminated and, at the same time, the verify result is transferred to outside through the detection circuit DTCT.

On the other hand, in a case where the threshold voltage of the memory cell MC does not exceed the verify voltage VH (or the voltage VL) i.e. in a case of "NO" in step S4), another writing i.e. an additional writing is executed and, at the same time, the verify result is transferred to outside through the detection circuit DTCT.

Another verify operation is executed to check whether the threshold voltage of the memory cell MC exceeds a predetermined threshold as a result of the additional write operation in step S5 (step S3).

Figure 6A:
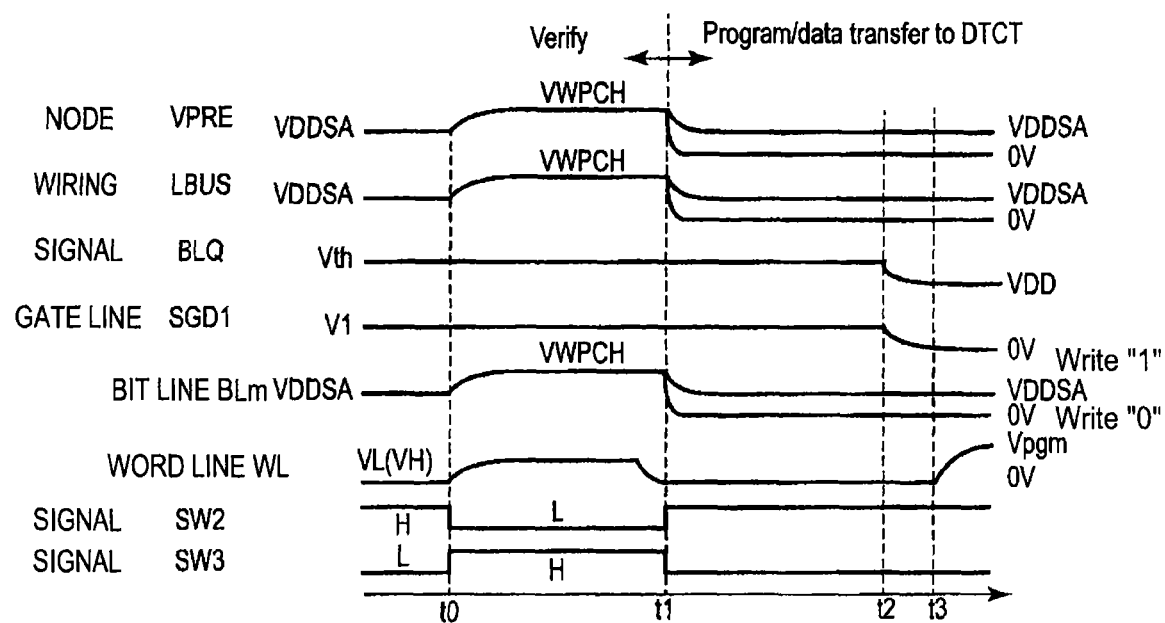
FIG. 6A is a time chart of signals and voltage levels of wirings which arise in the write operation.

The operations of steps S3 and S4 will be described with reference to FIGS. 6A and 6B. FIG. 6A shows a time chart of the signals shown in FIG. 3, and FIG. 6B is an explanatory diagram showing currents flowing in the sense amplifier 6 during writing.

5. <Detailed Description of Write Operation>

Figure 6B:
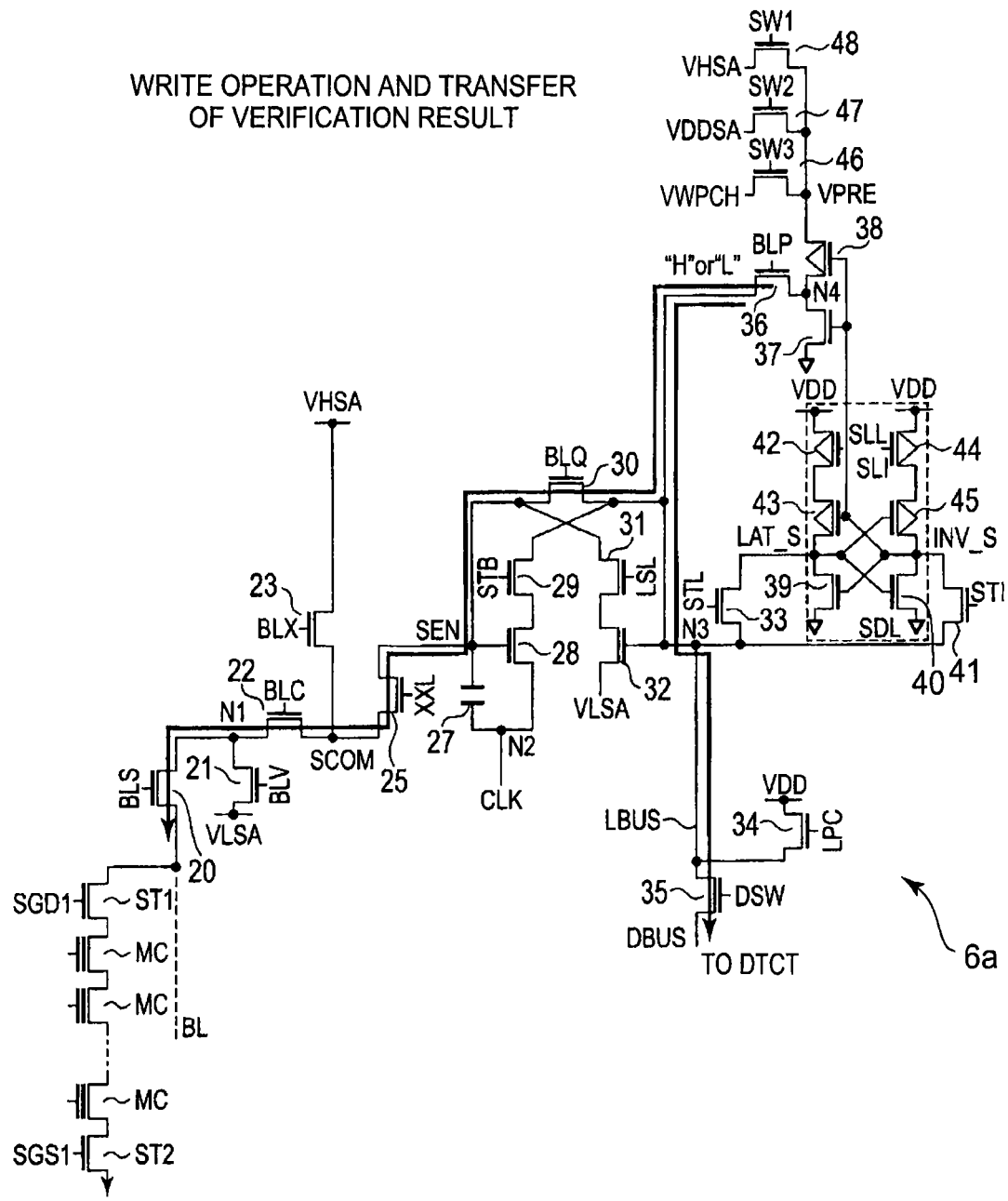
FIG. 6B is an explanatory diagram showing currents flowing in the sense amplifier during writing.

FIG. 6A shows voltage levels of the signals, and voltage levels of electric lines such as the word lines or wirings, and FIG. 6B is a circuit diagram of the sense amplifier 6. The following description is divided into first and second phases. The first phase presents a description for a verify operation which is performed after writing, and the second phase presents a description for another write operation and transfer of the verify result.

5.1 <Verify Operation>

As shown in FIG. 6A, the verify operation is performed during a period from a time t0 to a time t1. Specifically, at the time t0, the transistor 47 is turned off by the switch signal SW2 and the transistor 46 is turned on by the switch signal SW3 so that the voltage of the node VPRE is raised from the voltage VDDSA to the voltage VWPCH.

As a result, as shown in FIG. 6B, the voltage VWPCH is transferred to the bit line BL through the MOS transistors 38, 36, 30, the node SEN and the MOS transistors 25, 22, 20. Further, the voltage VWPCH is transferred also to the wiring LBUS through the MOS transistor 36. During this period, the voltage level of the signal BLQ is at a level "H" (=voltage Vth>voltage VDD).

As shown in FIG. 6A, the voltages of the bit line BL and the wiring LBUS are raised from the voltage VDDSA to the voltage VWPCH.

The verify voltage VL (or VH) is transferred to each selected word line WL while the voltage VREAD (not shown) is transferred to each non-selected word line WL to execute the verify operation.

The result of the verify operation is held in the node SEN, and the result of the verify operation is then transferred from the node SEN to the latch circuit SDL. The potential of the bit line BL in the additional write operation is equal to a value corresponding to the verify result. In the case where the corresponding NAND string 10 is not conductive, the threshold voltage of each corresponding memory cell MC is determined as exceeding the verify voltage, and data for performing a non-write operation is stored in the latch circuit SDL.

On the other hand, in the case where the corresponding NAND string 10 is conductive, the threshold voltage of the memory cell MC is determined as not exceeding the verify point, and data for performing a write operation is stored in the latch circuit SDL.

5.2 <Additional Write Operation and Transfer of Verify Result>

As shown in FIG. 6A, at the time t1, the switch signal SW3 is turned off and the switch signal SW2 is turned on so that the potential of the node VPRE decreases from the voltage VWPCH to the voltage VDDSA.

As shown in FIG. 6B, the MOS transistor 38 is turned on in the case where the latch circuit SDL holds, for example, the level "H" which indicates termination of the writing, as a result of the verify operation.

As shown in FIGS. 6A and 6B, the voltage VDDSA is transferred to the bit line BL and the wiring LBUS. Thus, the bit line BL is set at a non-write potential and, at the same time, information indicating that the verify is passed is transferred to the detection circuit DTCT.

On the other hand, in the case where the latch circuit SDL holds the level "L" indicating a necessity for additional writing, the MOS transistor 37 is turned on so that the bit line BL and the wiring LBUS are set to the ground potential (0 V) as shown in FIGS. 6A and 6B.

Accordingly, the potential of the bit line BL becomes a write potential, and at the same time, information indicating that the verify is not passed is transferred to the detection circuit DTCT.

Further, at a time t2, the gate line SGD1 is switched from a level "H" to a level "L" to make the NAND string 10 not conductive or to cut off the NAND string 10, so that the potential of the bit line BL is held at the voltage VDDSA.

Then, at a time t3, the voltage VPGM or the voltage VPASS is transferred to each word line WL to execute a write operation. The voltage VPASS is a voltage to be applied to the word line WL at a time of non-writing. In this case, the voltage VDDSA is applied to the bit line BL so that by applying the voltage VPASS to the word line, the voltage of the NAND string 10 become VDDSA.

In the case where the potential of the channel formed in the NAND string 10 is the voltage VDDSA, a non-write operation is performed. In the case where the potential of the channel is "0 V," electrons are injected from the channel to a charge accumulation layer of the memory cell MC so that the threshold is raised.

According to the embodiment, the speed of write operation can be increased as described below. The embodiment utilizes that the voltage level to be transferred to the bit line BL and the voltage level (verify result) to be transferred to the detection circuit DTCT are the same.

For example, in the case of performing a non-write operation, the voltage VDDSA is transferred to the bit line BL, and the level "H" indicating a non-write operation is transferred to the detection circuit DTCT. The embodiment utilizes that these voltage levels are the same as described above and can perform the write operation and the transfer of the verify result at the same time.

The embodiment will be compared with a case where the charge of the bit line BL and the transfer of the verify result to the detection circuit DTCT are performed in separate time periods.

According to the comparative case, the voltage VDDSA is transferred to the bit line BL, and the verify result is then transferred to the detection circuit DTCT. For this reason, the operation time until the transfer to the detection circuit DTCT is long.

However, according to the embodiment, the transfer of the voltage to the bit line BL and the transfer of the verify result to the detection circuit DTCT are performed at the same time. Thus, the operation time can be shortened.

Further, in the embodiment, after the verify operation, shift to the next operation is performed without reducing the voltages of the bit line BL and the wiring LBUS.

In contrast, it takes time to start a next operation in a case of reducing the potentials of the bit line BL and the wiring LBUS once to 0 V after a verify operation and then raising the potentials again to a predetermined value at the time of shifting to the next operation.

This is because raising a voltage requires a longer time than discharging a voltage.

As described above, the embodiment focuses on the fact that reusing already set voltages and discharging accumulated charge can shorten the time required to shift to the next operation.

According to the embodiment, in a non-write operation, the total operation time can be shortened by transferring the voltage VDDSA to the bit line BL while transferring the level "H" (voltage VDDSA) to the detection circuit DTCT and, in addition, by shifting the voltages from the voltage VWPCH directly to the voltage VDDSA.

The above description shows the case where the next operation is a non-write operation as an example. In the case where the operation next to the verify operation is a write operation involving setting the bit line BL to the ground potential, the speed of the write operation can be increased by discharging the voltage VWPCH to 0 V.

In the embodiment, the set voltages are reused as mentioned above, and the power consumption can be reduced as compared to a case where the set voltages are not reused.

A first modification of the first embodiment will be described with reference to FIGS. 7A and 7B. The modification differs from the first embodiment in that the voltage VWPCH as a fourth voltage higher than the voltage VDDSA as the second voltage is transferred to the bit line BL during a non-write operation.

In the modification, in a non-write operation of the bit line BL, the non-write voltage of the bit line BL can be prevented from decreasing due to a voltage, e.g. 0 V (=data writing voltage) transferred to the adjacent bit lines BL. The modification can prevent decrease in a non-write voltage of a bit line BL due to a voltage, e.g. 0 V (=data writing voltage) transferred to the adjacent bit lines BL, in a non-write operation of the bit line BL.

Figure 7A:
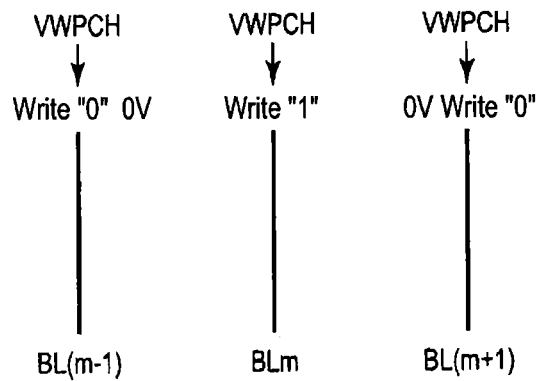
FIGS. 7A and 7B are diagrams for explaining a write operation of a non-volatile semiconductor memory device according to a modification of the first embodiment.

FIG. 7A shows write operations to three adjacent bit lines as an example. The bit lines are an m-th bit line BL (hereinafter, referred to as a "bit line BLm"), and an (m−1)-th bit line BL (hereinafter, referred to as a "bit line BL(m−1)") and an (m+1)-th bit line BL (hereinafter, referred to as a "bit line BL(m+1)") which are adjacent to the bit line BLm. Predetermined voltages mentioned below are transferred to the bit lines BL from the sense amplifier of FIG. 3. FIG. 7B shows a time chart of signals and signals of wirings in the modification.

Assume a case where, as shown in FIG. 7A, the voltage VWPCH is transferred to all the bit lines BL to perform verify operations, and then a writing permission voltage i.e. 0 V is transferred to the bit line BL(m−1) and the bit line BL(m+1) located on both sides of the bit line BLm from the corresponding sense amplifiers while the non-write voltage is transferred to the bit line BLm, for example.

In this case, there is a possibility that the bit line BLm located at the center may be subjected to being coupled from the bit line BL(m−1) and the bit line BL(m+1) so that the non-write voltage giving a potential of the bit line BLm, e.g. the voltage VWPCH decreases. The decrease in the non-write voltage leads to reduction in the output voltage of the pump circuit 8 arranged on a side of a voltage supply.

Figure 7B:
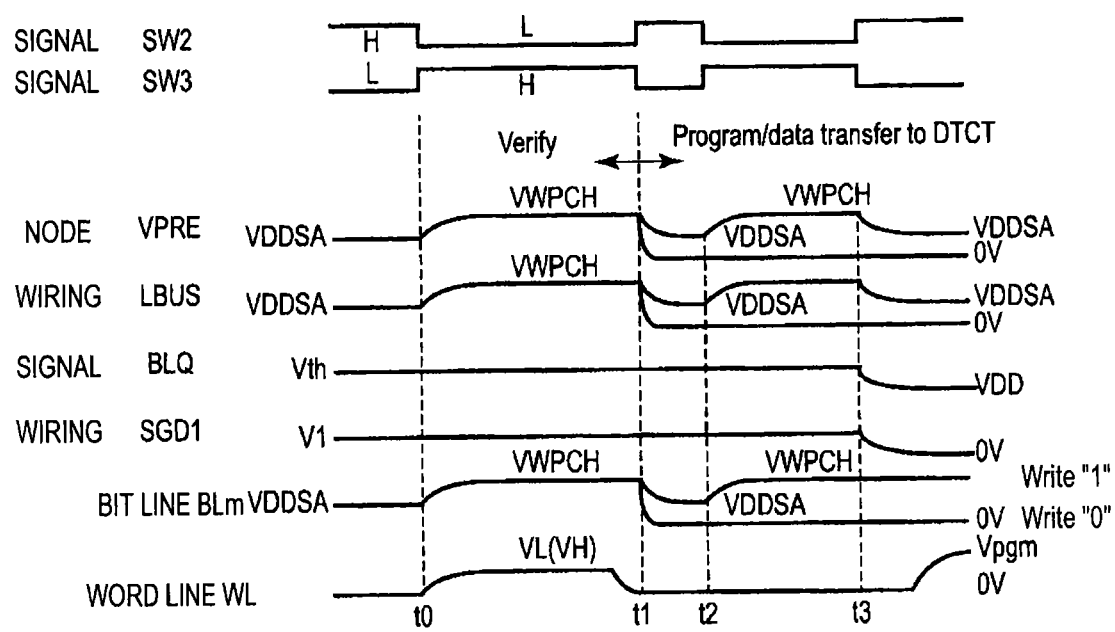

As shown in FIG. 7B, at a time t1, the switch signal SW2 of the transistor 47 is turned on and the switch signal SW3 of the transistor 46 is turned off so as to shift the potential of the node VPRE from the voltage VWPCH to the voltage VDDSA. The above voltage shift is done to avoid the potential of the bit line BLm (voltage VWPCH) from being influenced by each adjacent bit line BL (=0 V). In the case where the potential of the bit line BLm (voltage VWPCH) is decreased, the output of the pump circuit 8 is decreased, and thus it takes time for the pump circuit 8 to output the voltage VWPCH.

In order to prevent such a situation, the MOS transistor 46 is turned off to stop outputting the voltage VWPCH, and the voltage VDDSA lower than the voltage VWPCH is transferred to the bit line BL. The potential of the bit line BL decreases to a voltage equal to or below the voltage VDDSA due to the potential of each adjacent bit line BL. However, the voltage VWPCH is transferred again to the bit line BLm once the potential of the bit line BL stabilizes.

Specifically, at a time t2, the switch signal SW2 is turned off and the switch signal SW3 is turned on so that the voltage VWPCH is transferred to the node VPRE.

By the transfer of the voltage VWPCH, the potentials of the wiring LBUS and the bit line BLm rise from the voltage VDDSA to the voltage VWPCH.

Then, at a time t3, the signal BLQ is shifted from the voltage Vth to the voltage VDD and the gate line SGD1 is shifted to 0 V while the switch signal SW3 is turned off again and the switch signal SW2 is turned on again As a result, the potential of the node VPRE is shifted to the voltage VDDSA again. This is done to prevent burden on the pump circuit 8 and to avoid coincidence between generation of the voltage VPGM and generation of the voltage VWPCH which are described below.

Thus, at and after the time t3, the potential of the node VPRE shifts to the voltage VDDSA, but the NAND string 10 and the bit line BLm are cut off. For this reason, the potential of the bit line BLm remains at the voltage VWPCH. The potential of the channel of the NAND string 10 remains at the voltage VWPCH.

Then, the write voltage VPGM or VPASS is transferred to each word line WL to execute a write operation.

The above description shows a case of a non-write operation as an example, but the same applies to a case of writing data "0." In the case of writing data "0," the node VPRE is at 0 V at the time t1, and the wiring LBUS and the bit line BL are at 0 V accordingly.

Then, the write voltage is transferred to each word line WL.

A non-volatile semiconductor memory device according to the modification can achieve the following advantageous effects in addition to those of the first embodiment.

The modification prevents decrease in the output of the pump circuit 8 as described with reference to FIG. 7B. Although the potential of the bit line BLm decreases from the time t1 to the time t2, it is possible to quickly pump up the potential of the bit line BLm with the first pump circuit 500 of FIG. 4.

As mentioned above, in the case where the output of the first pump circuit 500 itself decreases, it takes time to return to the original output level.

In this regard, in the modification, the output of the first pump circuit 500 is only stopped until the time t2, and the output of the first pump circuit 500 does not decrease even when the bit line BLm is reduced to the voltage VDDSA. Thus, it is possible to quickly transfer the voltage VWPCH to the bit line BL.

Accordingly, even when the potential of the bit line BLm is reduced, it is possible to start a next write operation immediately.

Further, the modification can reduce disturbing to writing as will be described below. In the modification, the voltage VWPCH (>voltage VDDSA) is transferred to the bit line BLm as a non-write voltage.

As a result, the potential difference between a channel and a control gate of each memory cell MC can be reduced so that it is possible to minimize electron injection from the channel into a charge accumulation layer. Thus, it is sufficient that electron injection is performed to the extent that the threshold distribution of the memory cells MC does not change. Accordingly, it is possible to reduce the possibility of erroneously writing data "0."

A second modification of the first embodiment will be described. In the modification, the potential of the capacitor element 27 in FIG. 3 is boosted by pumping, so as to transfer a voltage higher than the voltage VDDSA to the bit line BL.

Figure 8A:
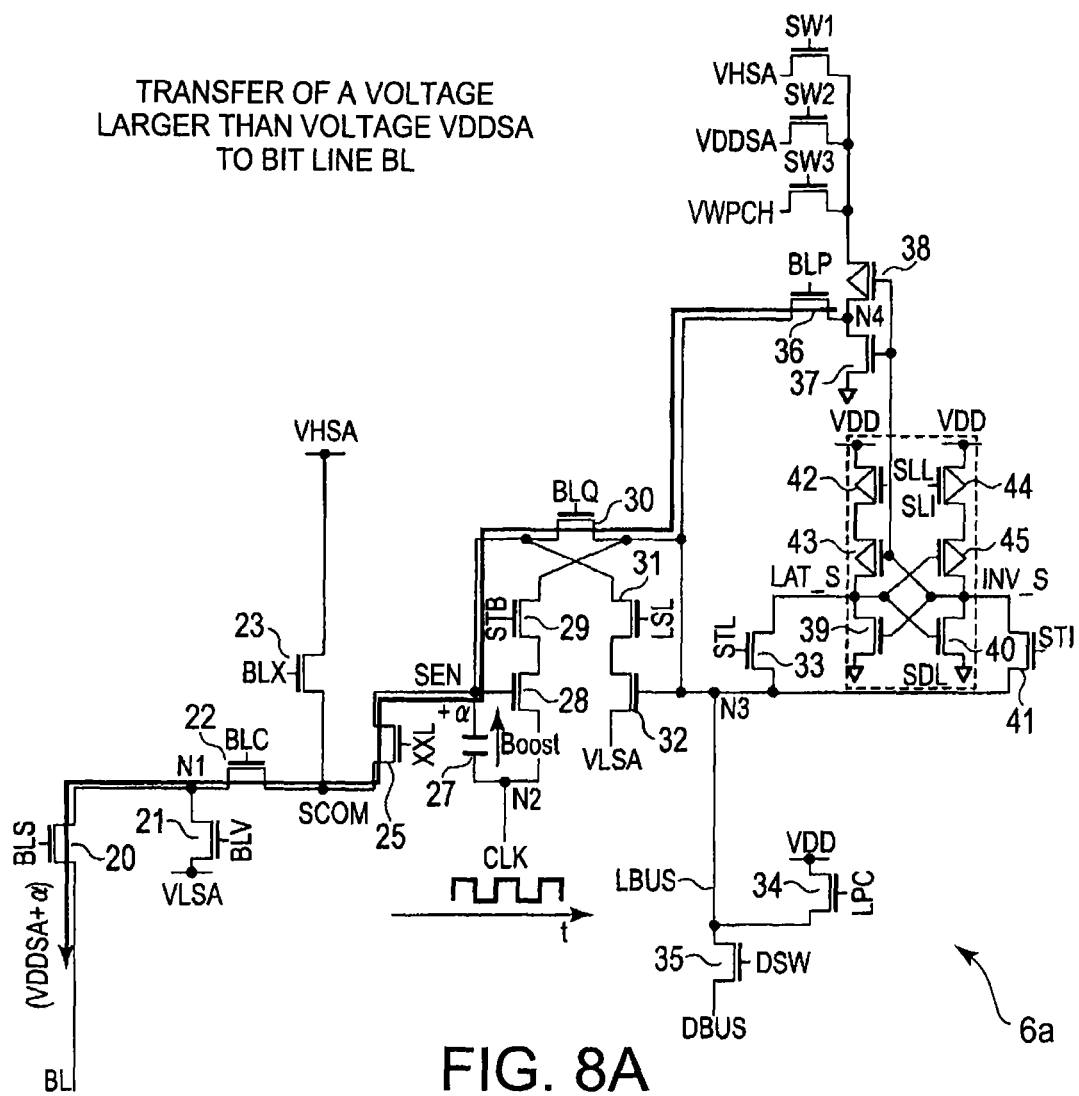
FIGS. 8A and 8B are diagrams for explaining a write operation of a non-volatile semiconductor memory device according to another modification of the first embodiment.
Figure 8B:
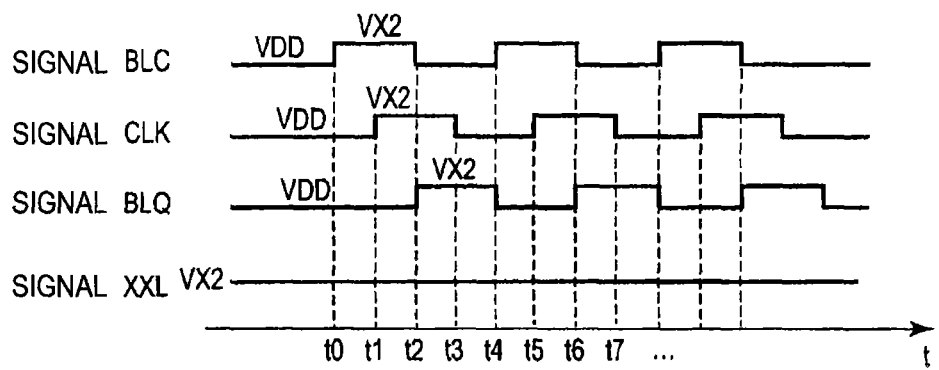

A configuration and operations of the second modification will be described with reference to FIGS. 8A and 8B. As shown in FIG. 8A, a non-volatile semiconductor memory device according to the modification raises the potential of the node SEN by an amount of +α, by pumping when transferring the voltage VDDSA to the bit line BL.

Specifically, the clock signal CLK is set to a level "H" at a speed corresponding to an internal clock, and a voltage as a fifth voltage corresponding to the clock signal CLK is provided to the capacitor element 27.

In the modification, such a configuration makes it possible to supply a voltage higher than the voltage VDDSA to the bit line BL. Thus, the first pump circuit 500 may be removed. In the case where the voltage VWPCH is to be transferred to the bit line BL, performing the pumping allows transfer of a voltage (VWPCH+α) to the bit line BL.

The operations of the modification will be described with reference to FIG. 8B. FIG. 8B is a time chart showing the timings of the clock signal CLK and the providing timings of signals to be provided to the transistors 22, 25, 30. The vertical axis indicates the voltages of the signal BLC, the clock signal CLK, the signal BLQ and the signal XXL, and the horizontal axis indicates time t. The signal XXL is always at a level "H."

At a time t0, the signal BLC is set to a level "H" to turn on the MOS transistor 22. With the MOS transistor 22 turned on, the voltage VDDSA is transferred to the bit line BL.

Then, at a time t1, the clock signal CLK is set to the level "H." As a result, a voltage corresponding to the clock signal CLK (hereinafter, the voltage will be referred to as "α1") is transferred to the node SEN through the capacitor element 27.

By the transfer of the voltage corresponding to the clock signal CLK, a voltage (VDDSA+α1) is transferred to the bit line BL through the node SEN. At the time t1, the signal BLQ is set to a level "L." This is because backflow of the voltage occurs when the signal BLQ is at the level "H." To prevent the backflow, the signal BLQ is set to the level "L" when the voltage (VDDSA+α1) is to be transferred to the bit line BL.

Then, at a time t2, the signal BLC is set to a level "L" and the signal BLQ is set to the level "H," and then the clock signal CLK is set to a level "L." Even when the potential of the node SEN is decreased at this timing by the clock signal CLK, the potential of the bit line BL never decreases because the signal BLC is at the level "L."

As the signal BLQ is set at the level "H", even when the potential of the node SEN is decreased, the voltage VDDSA is supplied to the node SEN through the MOS transistor 36 for compensating the decrease.

In addition to the advantageous effects mentioned above, the second modification can reduce a chip area of the non-volatile semiconductor memory device, and supply a voltage higher than the voltage VDDSA to the bit line BL. The non-volatile semiconductor memory device according to the modification can supply a voltage higher than the voltage VDDSA to the bit line BL without using the first pump circuit 500. This makes it possible to prevent disturbing writing and to reduce the chip area.

A non-volatile semiconductor memory device according to a second embodiment will be described with reference to FIGS. 9A to 15B and 16. FIGS. 9A to 15A are explanatory diagrams showing currents flowing in the circuit of a sense amplifier. FIGS. 9B to 15B are time charts showing the voltage levels of nodes and wirings. The non-volatile semiconductor memory device according to the second embodiment relates to a voltage to be transferred to a bit line BL in a bad column caused by disconnection, for example. As mentioned above, write data is transferred to a data latch circuit XDL from outside. However, write data is transferred only to data latch circuits XDL corresponding to bit lines BL which do not have a disconnection, for example, and write data does not enter the data latch circuits XDL corresponding to columns having a disconnection i.e. bad columns. For this reason, data held in a latch circuit SDL corresponding to a bad column is at a level "H" which is for performing a non-write operation.

A non-write voltage is transferred to a bit line BL corresponding to a bad column. However, in the case where there is a disconnection, for example, when a voltage VDDSA is transferred, a leakage current is generated so that the potential of the bit line BL decreases.

The decrease in the potential of the bit line BL may possibly influence the adjacent non-write bit line BL and decrease the potential of the adjacent bit line BL.

Consequently, the adjacent bit line BL fails to secure a large potential difference against each word line WL despite that a non-write operation is to be performed. This results in a possibility of an erroneous writing.

In the second embodiment, 0 V is transferred to each bit line BL corresponding to a bad column to prevent the above problem. As will be described below, in the case of a bad column, data "1" is stored in the data latch circuit XDL regardless of whether there is leakage in the bit line BL.

Hereinafter, calculating steps until transferring 0 V to a bit line BL corresponding to a bad column will be described.

6. <Ccalculating Flow>
6.1 <Data Load>

Figures 9A, 9B:
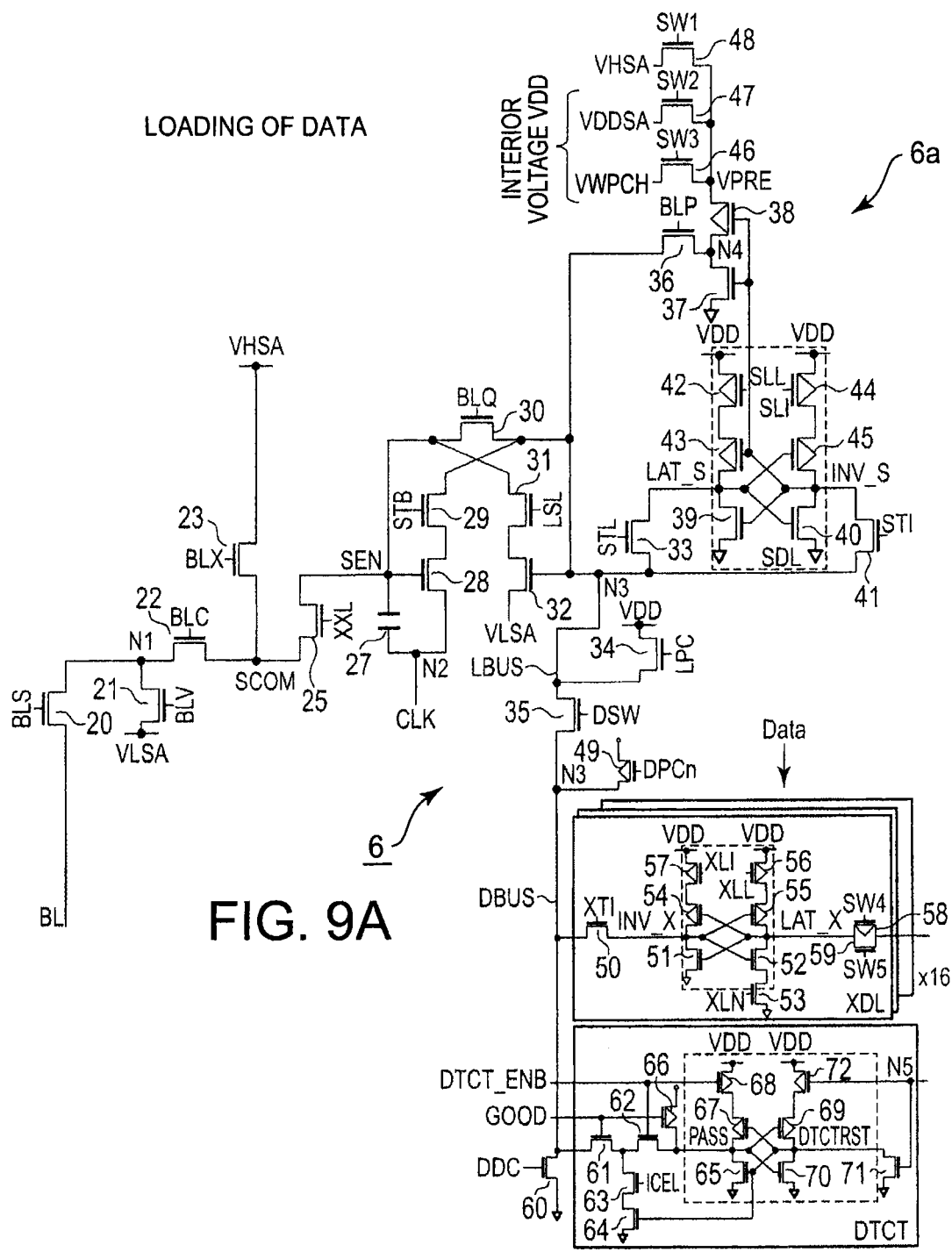

A sense amplifier 6 receives write data (data "0" or "1") from outside. As shown in FIG. 9A, the received write data is stored in the data latch circuit XDL.

"0" (=level "L") corresponds to writing data "0" while "1" (=level "H") corresponds to writing data "1" (non-write operation).

As shown in FIG. 9B, the data latch circuit XDL holds either data "0" or "1" when each memory cell MC is one on which writing is performed. The data latch circuit XDL holds data "1" when the bit line BL connected to the memory cell MC is a bad column.

6.2 <Transfer from Data Latch Circuit XDL to Latch Circuit SDL>

Figures 10A, 10B:
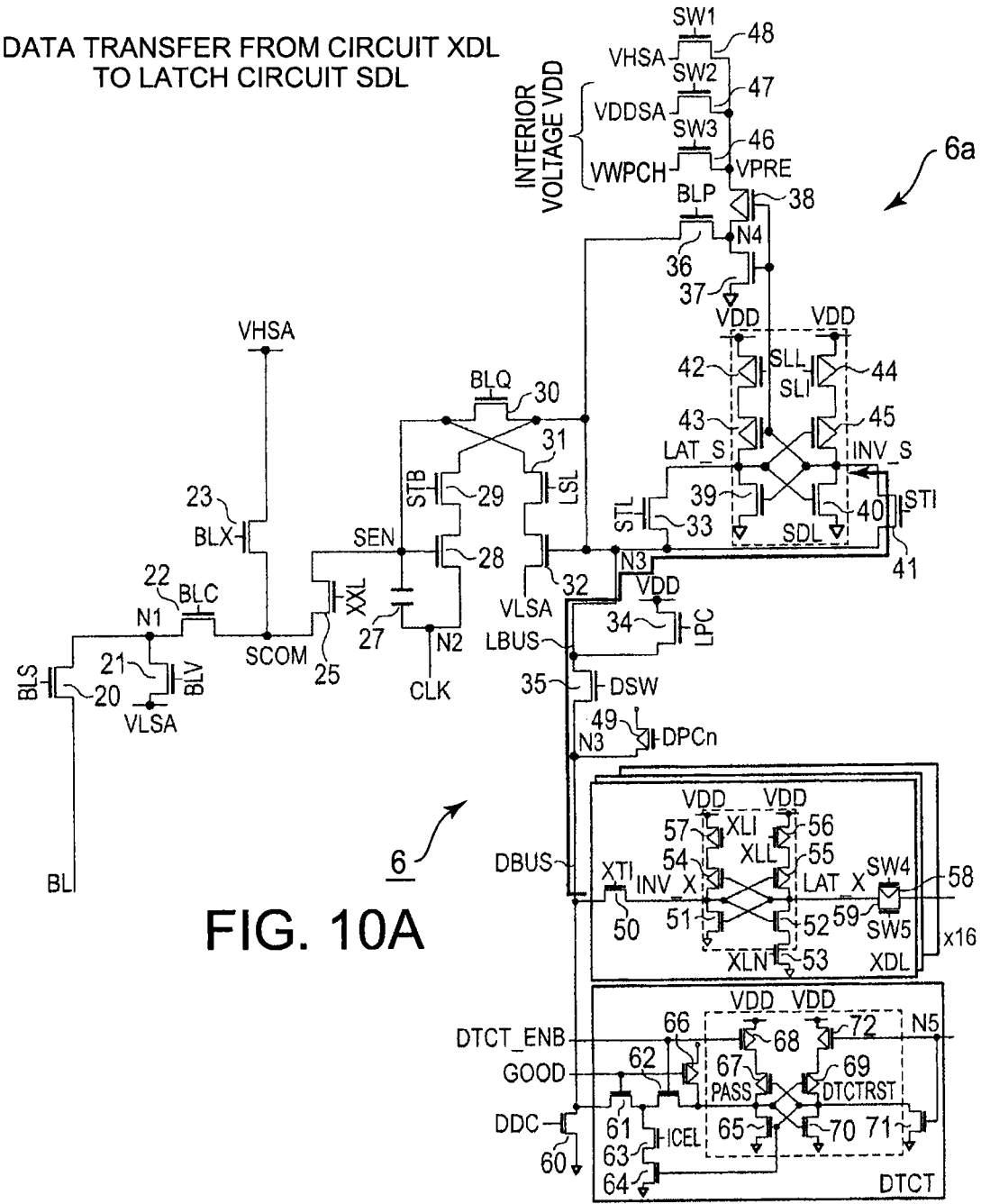

As shown in FIG. 10A, the write data is transferred from the data latch circuit XDL to the latch circuit SDL. Specifically, signals XTI, DSW, STI are set to a level "H" to transfer the value of a node INV_X to a node INV_S.

As shown in FIG. 10B, the value of a node LAT_X is transferred to the node INV_S.

6.3 <Reset of Detection Circuit DTCT>

Figures 11A, 11B:
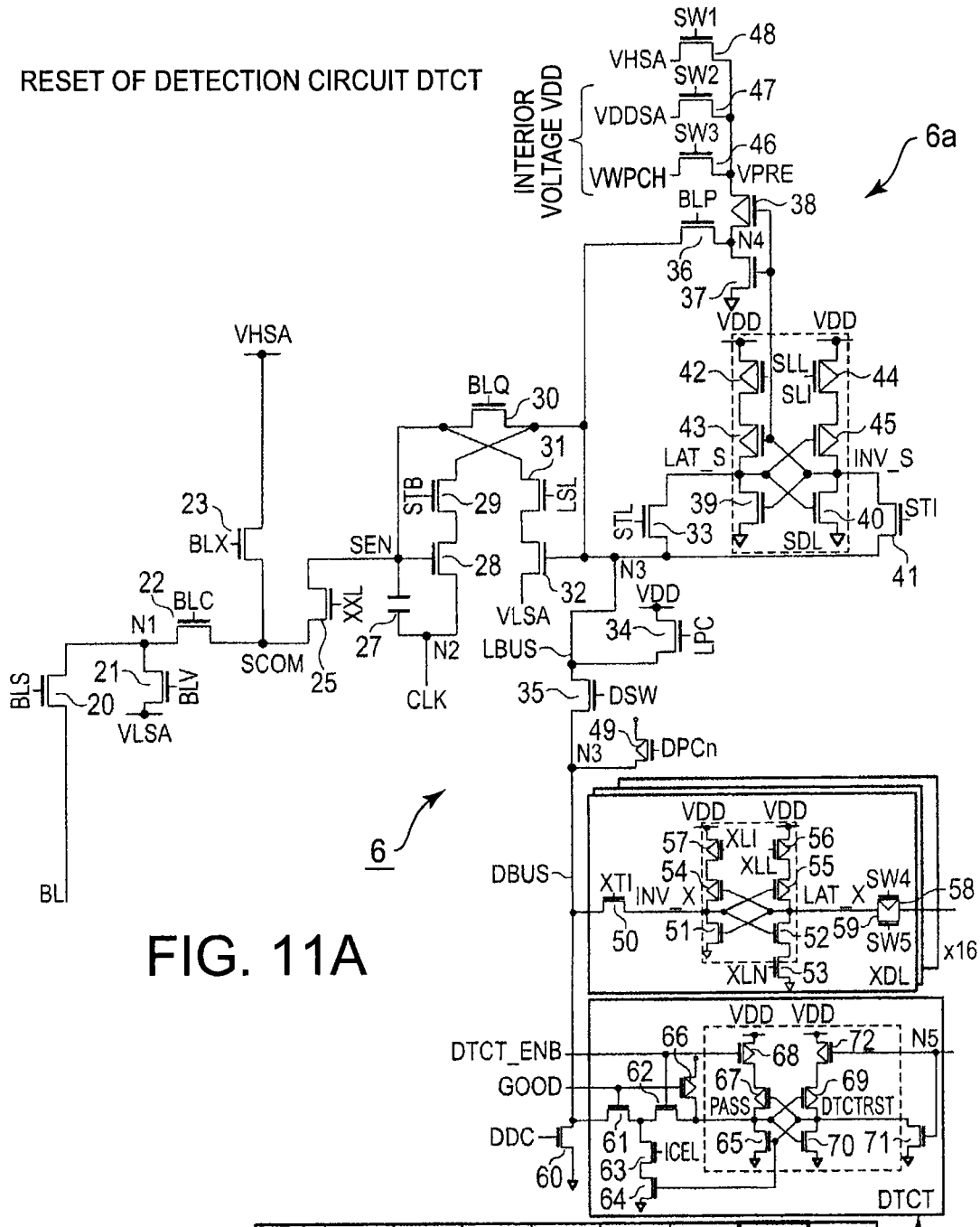

Then, a detection circuit DTCT is reset as shown in FIG. 11A. Signals DTCT_ENB, DDC are set to a level "H." The voltage level of a node PASS at this item is shown in FIG. 11B. In the case of a sense amplifier 6 corresponding to a good bit line BL which does not have a defect, a signal GOOD is at a level "H," and the node PASS is at a ground potential as shown in FIG. 11B.

On the other hand, in the case of a sense amplifier 6 corresponding to a bit line BL which is a bad column, the signal GOOD is at a level "L." Thus, the node PASS is not grounded and is maintained at a level "H."

6.4 <Charging of Node SEN>

Figures 12A, 12B:
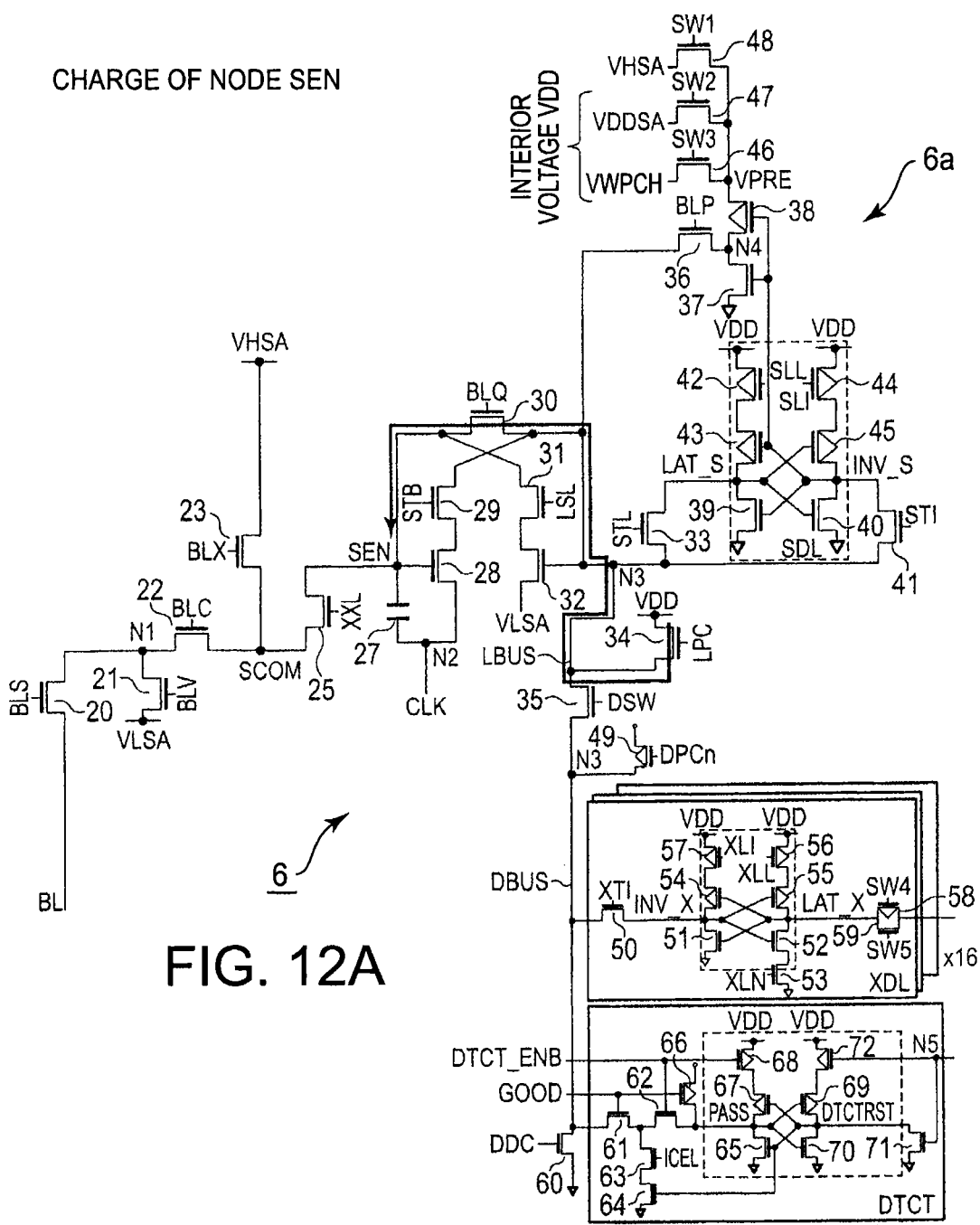

As shown in FIG. 12A, a node SEN is then charged. Specifically, signals LPC, BLQ are set to a level "H" to transfer a voltage VDD to the node SEN.

By the transfer of the voltage VDD to the node SEN, the voltage level of the node SEN is set to a level "H" as shown in FIG. 12B.

6.5 <Transfer of Voltage Level of Detection Circuit DTCT to Node SEN>

Figures 13A, 13B:
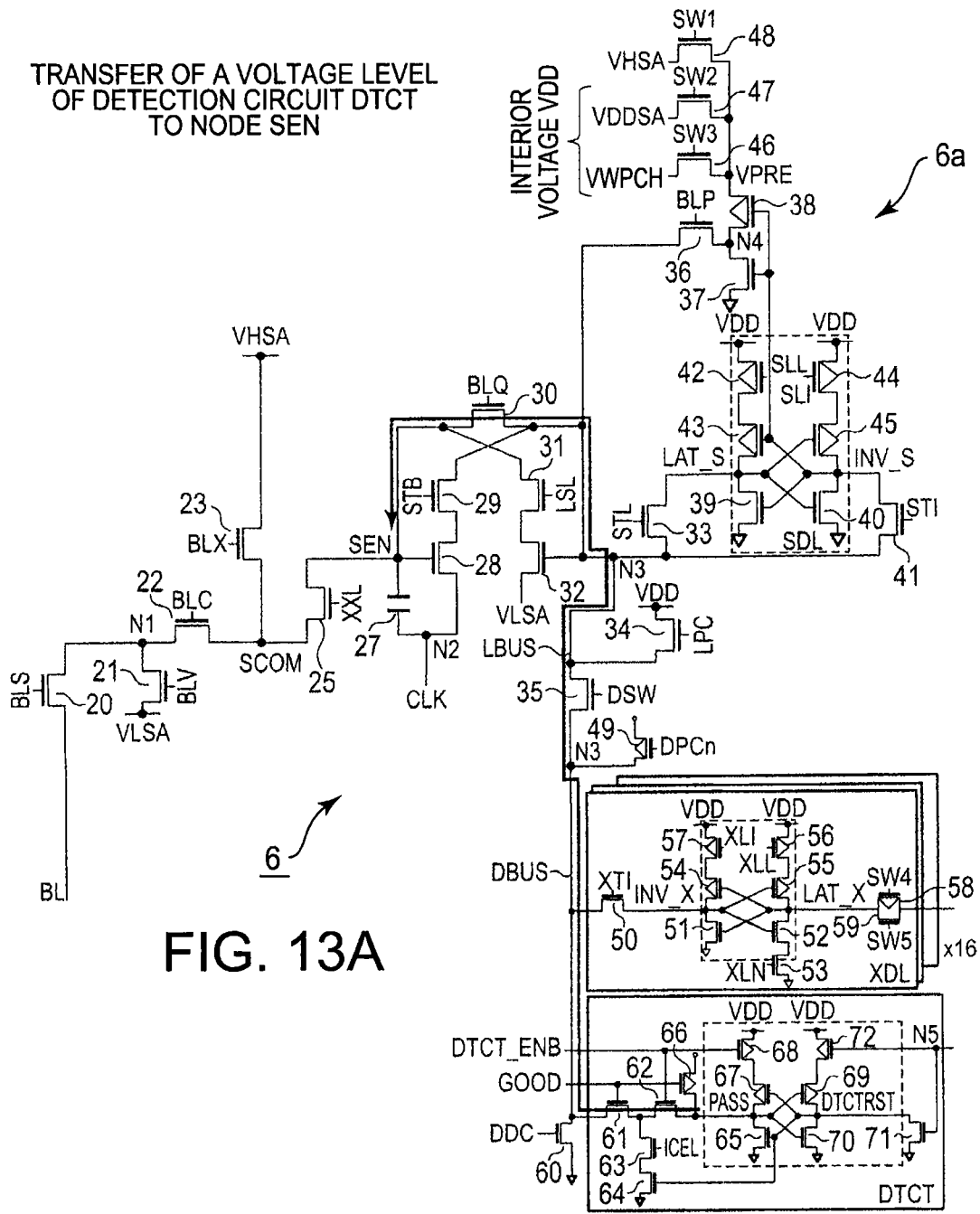

As shown in FIG. 13A, the voltage level of the node PASS of the detection circuit DTCT is transferred to the node SEN. Specifically, the signals DTCT_ENB and BLQ are set to the level "H." As mentioned above, the signal GOOD is at the level "L" in the case where the bit line BL is a bad column having a disconnection, for example.

Thus, as shown in FIG. 13B, in the case of a bad column, a MOS transistor 61 is maintained in an off state so that the node SEN is maintained at the level "H."

On the other hand, in the case where the signal GOOD is at the level "H," the MOS transistor 61 is turned on so that the voltage level of the node PASS is transferred to the node SEN. In this case, the voltage level of the node SEN becomes the ground potential.

6.6 <Transfer of Voltage Level of Node SEN to Latch Circuit SDL>

Figures 14A, 14B:
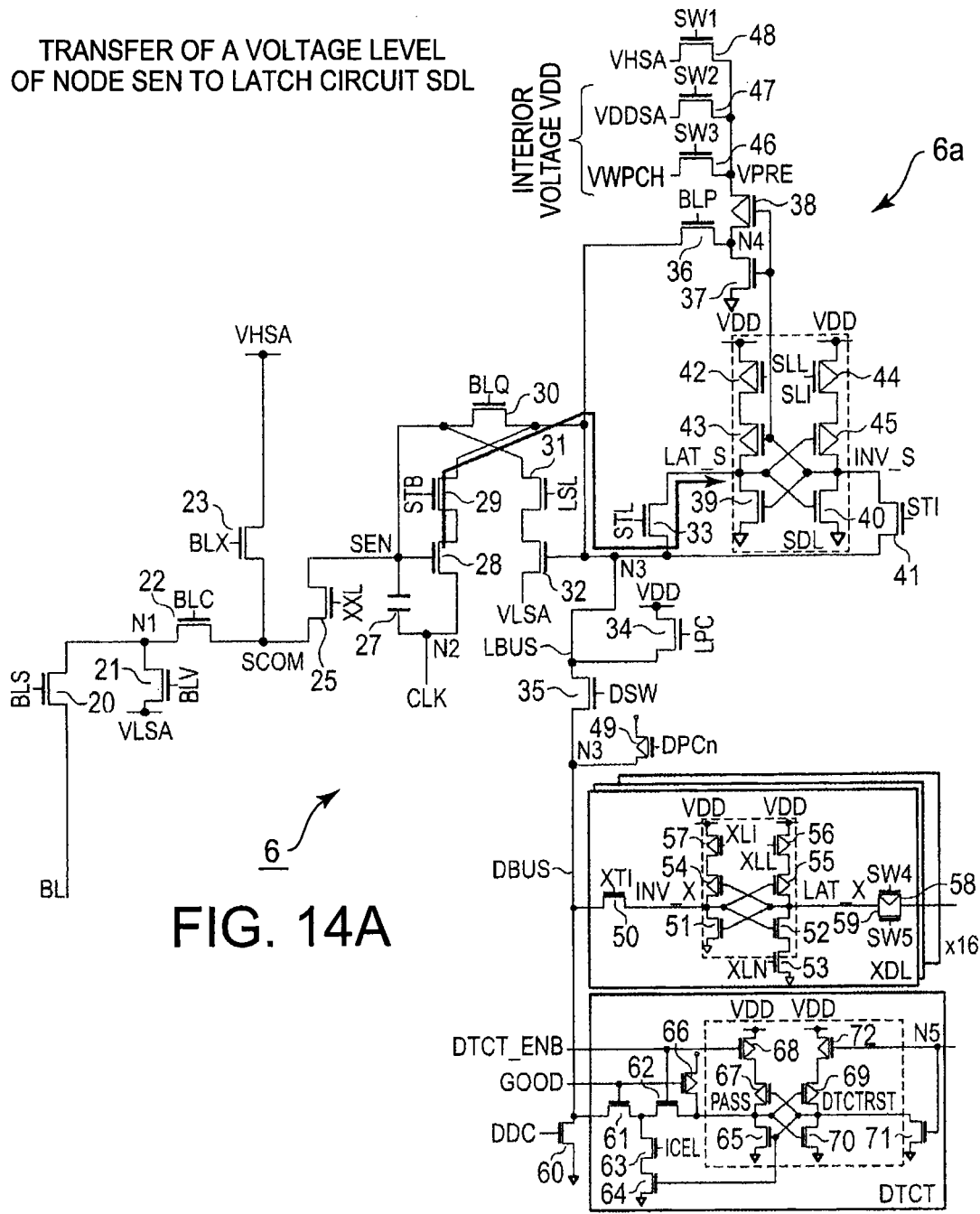

As shown in FIG. 14A, the voltage level of the node SEN (inverted data) is transferred to the latch circuit SDL. Specifically, signals STB, STL are set to a level "H" to connect the node SEN to a node LAT_S in the latch circuit SDL through MOS transistors 29, 33.

By the transfer of the voltage level to the latch circuit SDL, the latch circuit SDL is shifted to a level "L" in the case where the node SEN is at the level "H" as shown in FIG. 14B. On the other hand, in the case where the node SEN is at a level "L," a MOS transistor 28 is off so that the node LAT_S is maintained at the level "H."

6.7 <Write Operation>

Figures 15A, 15B:
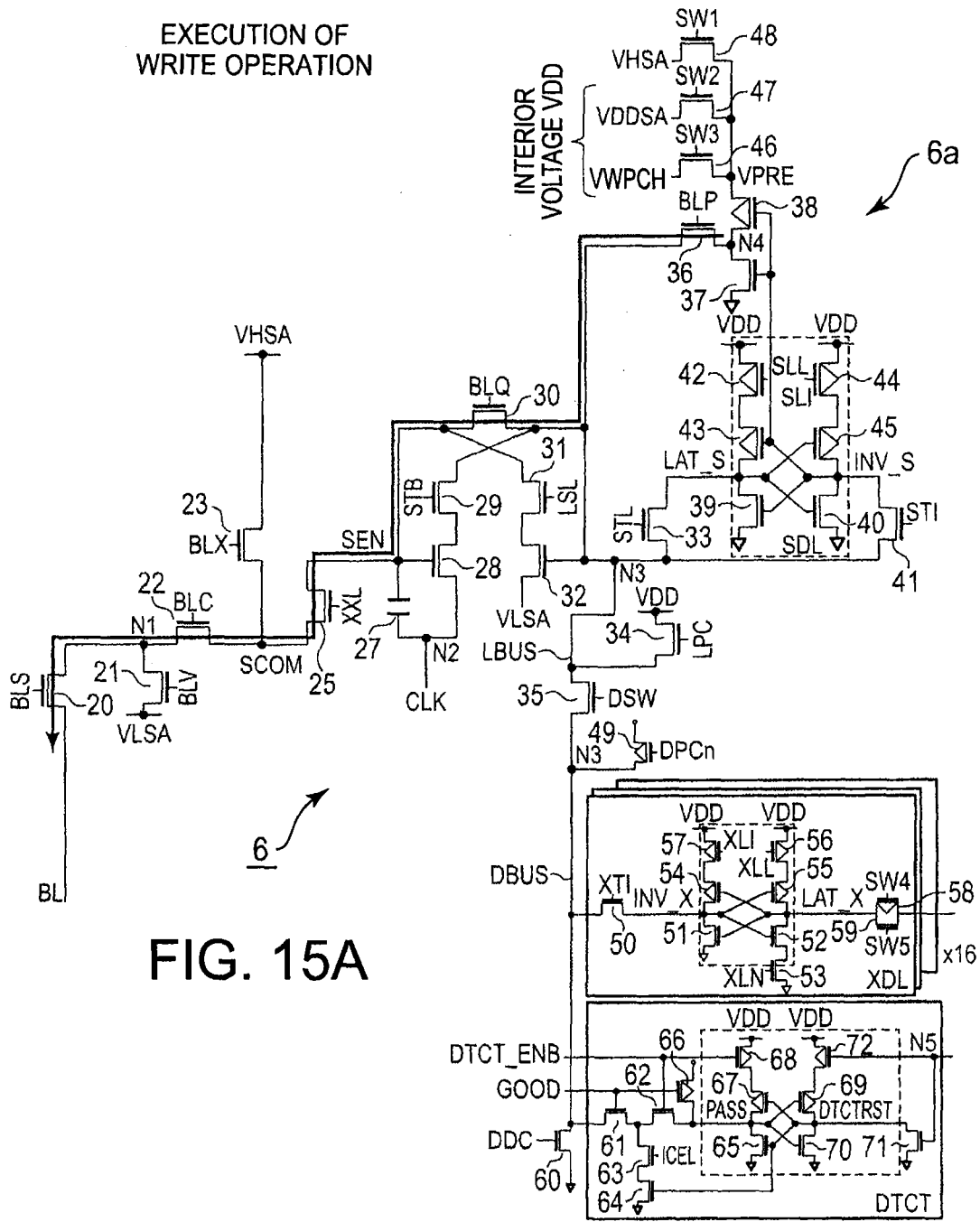

As shown in FIG. 15A, a write operation is then executed. A voltage corresponding to the data held in the node LAT_S of the latch circuit SDL as shown in FIG. 14B is transferred to the bit line BL.

Specifically, as shown in FIG. 15B, in the case where the node LAT_S is at a level "L," a MOS transistor 37 is turned on so that 0 V is transferred to the bit line BL through MOS transistors 36, 30, 25, 22 and 20.

A voltage VWPCH, i.e. the non-write voltage is transferred to the bit line BL in the case where the node LAT_S is at the level "H."

Accordingly, 0 V is transferred to each bit line BL which is a bad column as shown in FIG. 15B.

7. <Shift of Voltage Level of Bit Line BL During Writing>

Figure 16:
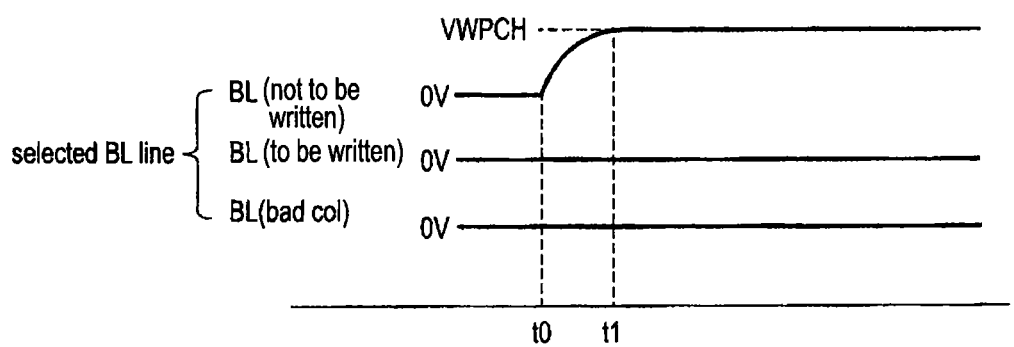
FIG. 16 is a time chart showing voltage levels to be transferred to bit lines in write operation according to the second embodiment.

FIG. 16 shows voltage levels transferred to bit lines BL as a result of the above calculation. FIG. 16 shows the voltage levels of bit lines BL during writing of data "0" and "1," and a shift of the voltage of a bit line BL corresponding to a bad column.

As shown in FIG. 16, at a time t0, the voltage VDDSA is transferred to a bit line BL corresponding to a memory cell MC to which data "1" is to be written, while 0 V is transferred to a bit line BL corresponding to a memory cell MC to which data "0" is to be written.

In the case of a bit line BL of a bad column, the latch circuit SDL is at the level "H," and thus the sense amplifier 6 transfers 0 V to the bit line BL, as in the case of writing data "0."

The non-volatile semiconductor memory device according to the second embodiment described above can achieve an advantageous effect of improving the reliability of operations, in addition to those of the non-volatile semiconductor memory device according to the first embodiment. According to the second embodiment, it is possible to avoid a current flowing through a bit line BL having a disconnection, for example.

In contrast, in the case where a pump circuit 8 is driven despite that a disconnection exists in the bit line BL which causes a leakage current, the output of the pump circuit 8 may possibly decrease.

Further, in this case, though the non-write voltage needs to be transferred to the bit line BL, a disconnection exists in the bit line BL, a leakage current is caused, and the potential of the bit line BL decreases so that the bit line BL may possibly influence the adjacent bit line for non-writing. The potential of the adjacent bit line may decrease due to coupling. Thus, even if the bit line BL needs to be set to a non-write state, the potential difference between the bit line BL and each word line WL can not be set small, which leads to a possibility of an erroneous writing.

In this case, during writing, the potential difference between a channel and a control gate of a memory cell MC may possibly increase, and data "0" may possibly be written.

On the other hand, in the case of the non-volatile semiconductor memory device according to the second embodiment, 0 V is transferred to a bit line BL corresponding to a bad column. Since 0 V is transferred as mentioned above, it is possible to prevent a situation where a leakage current decreases the voltage of the adjacent bit line, which results in an erroneous writing. Accordingly, the reliability of operation can be maintained.

A modification of the second embodiment will be described with reference to FIGS. 17A to 20B. In the modification, the voltage VWPCH is transferred to a bit line BL in the case where the bit line BL is a bad column but leakage current is not generated in the bit line BL itself. A calculation flow described below is executed after the termination of the write operation in the second embodiment.

8. <Calculation Flow>
8.1<Verify of Writing>

Figures 17A, 17B:
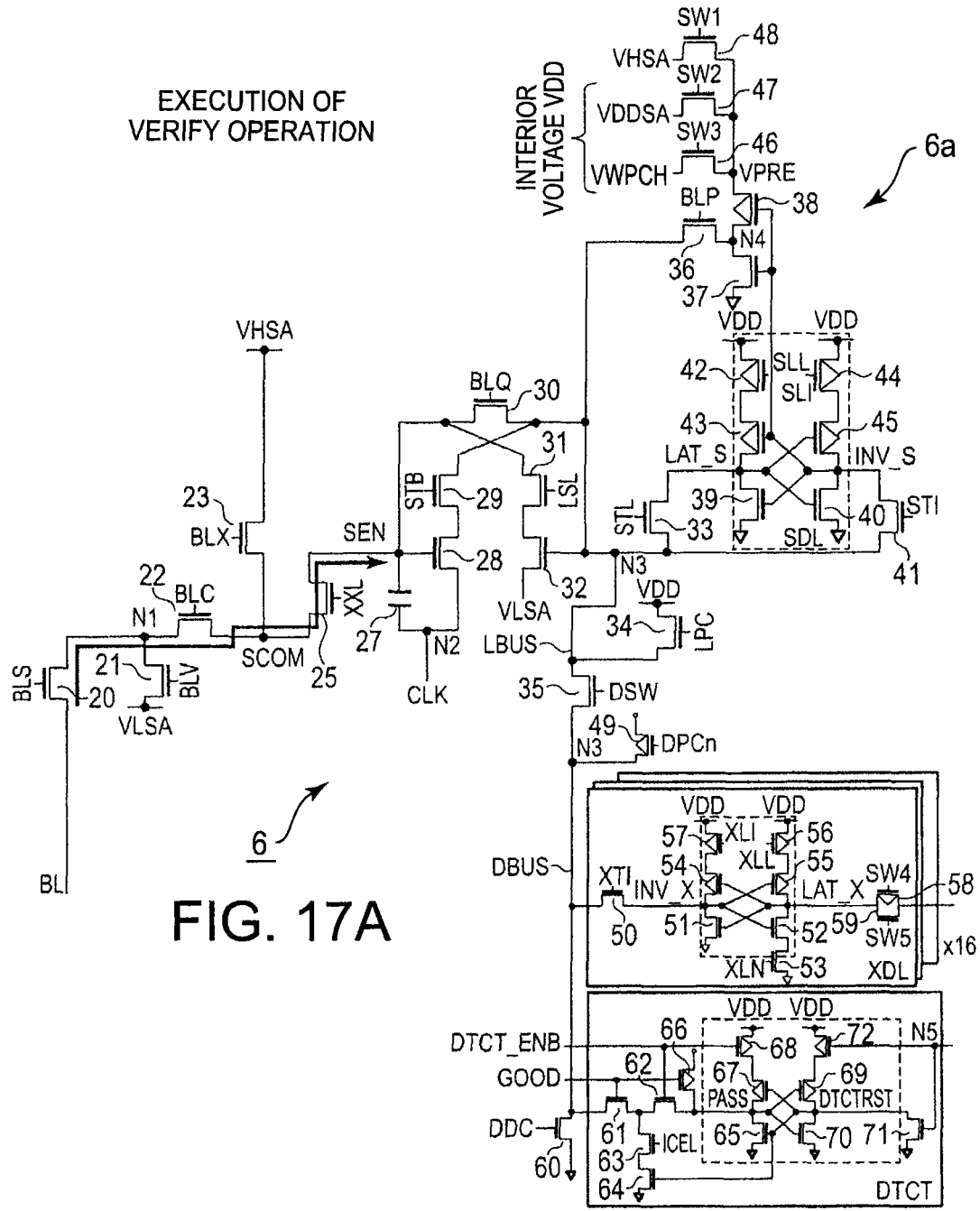

As shown in FIG. 17A, a verify operation is performed. Specifically, one of verify voltages VH, VL is transferred to each word line WL to check whether or not a NAND string 10 is conductive.

As shown in FIG. 17B, in the case where the NAND string 10 is conductive as a result of the verify operation, the node SEN shifts to the level "L" as a result of charge sharing. On the other hand, in the case where the NAND string 10 is not conductive, charge sharing is not performed so that the node SEN is maintained at the level "H."

Data writing is performed on each memory cell MC connected to a bit line BL which is a bad column but does not have a disconnection. For this reason, the threshold of the memory cell MC rises and exceeds the verify voltage VH. In this case, the node SEN is at the level "H."

8.2 <Transfer of Voltage Level of Node SEN to Latch Circuit SDL>

Figures 18A, 18B:
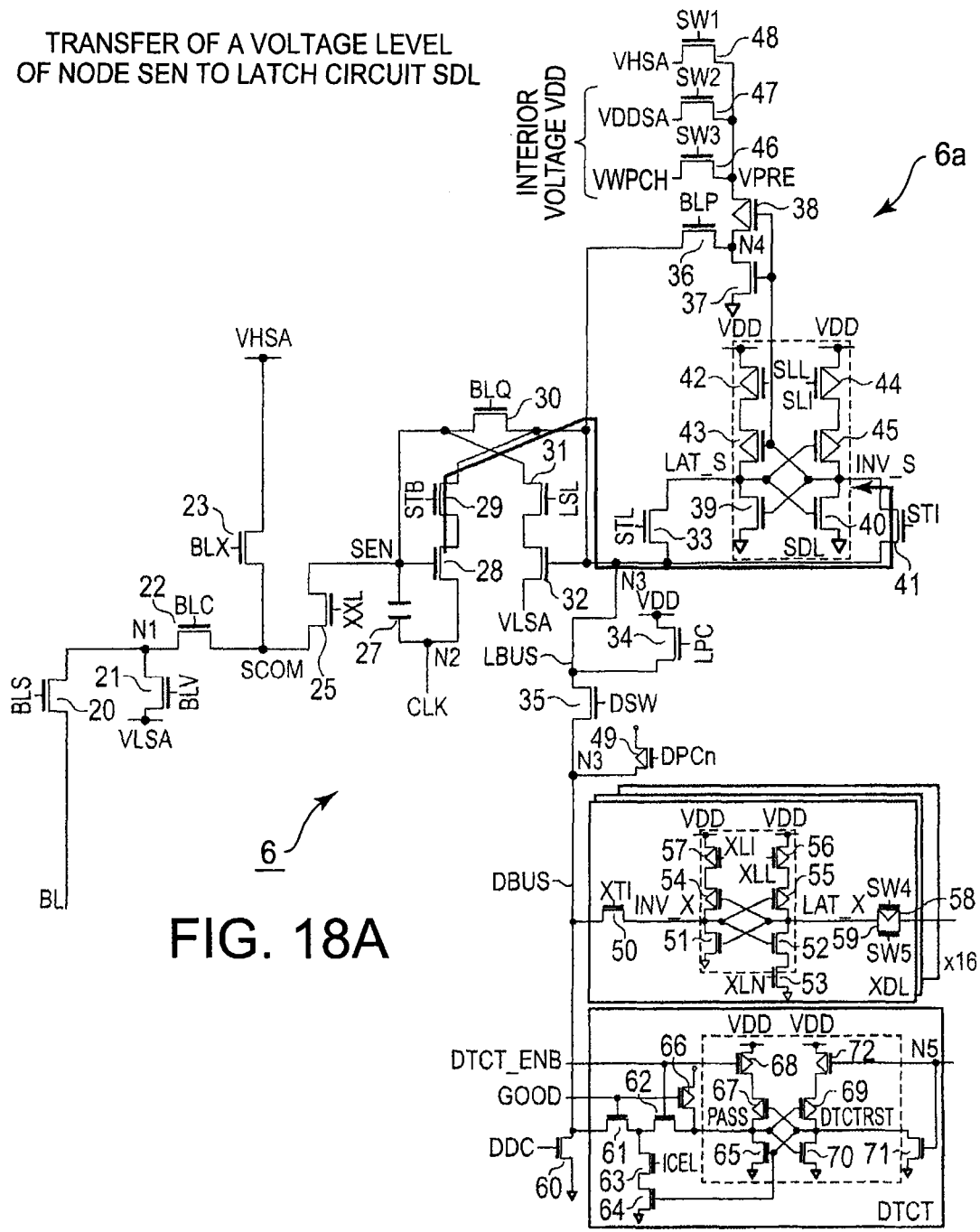

As shown in FIG. 18A, the voltage level of the node SEN is transferred to the latch circuit SDL. Specifically, the signals STB, STI are set to the level "H."

As shown in FIG. 18B, the latch circuit SDL holds data "1" when the voltage level of the node SEN is the level "H."

8.3 <Transfer of Data of Latch Circuit SDL to Detection Circuit DTCT>

Figures 19A, 19B:
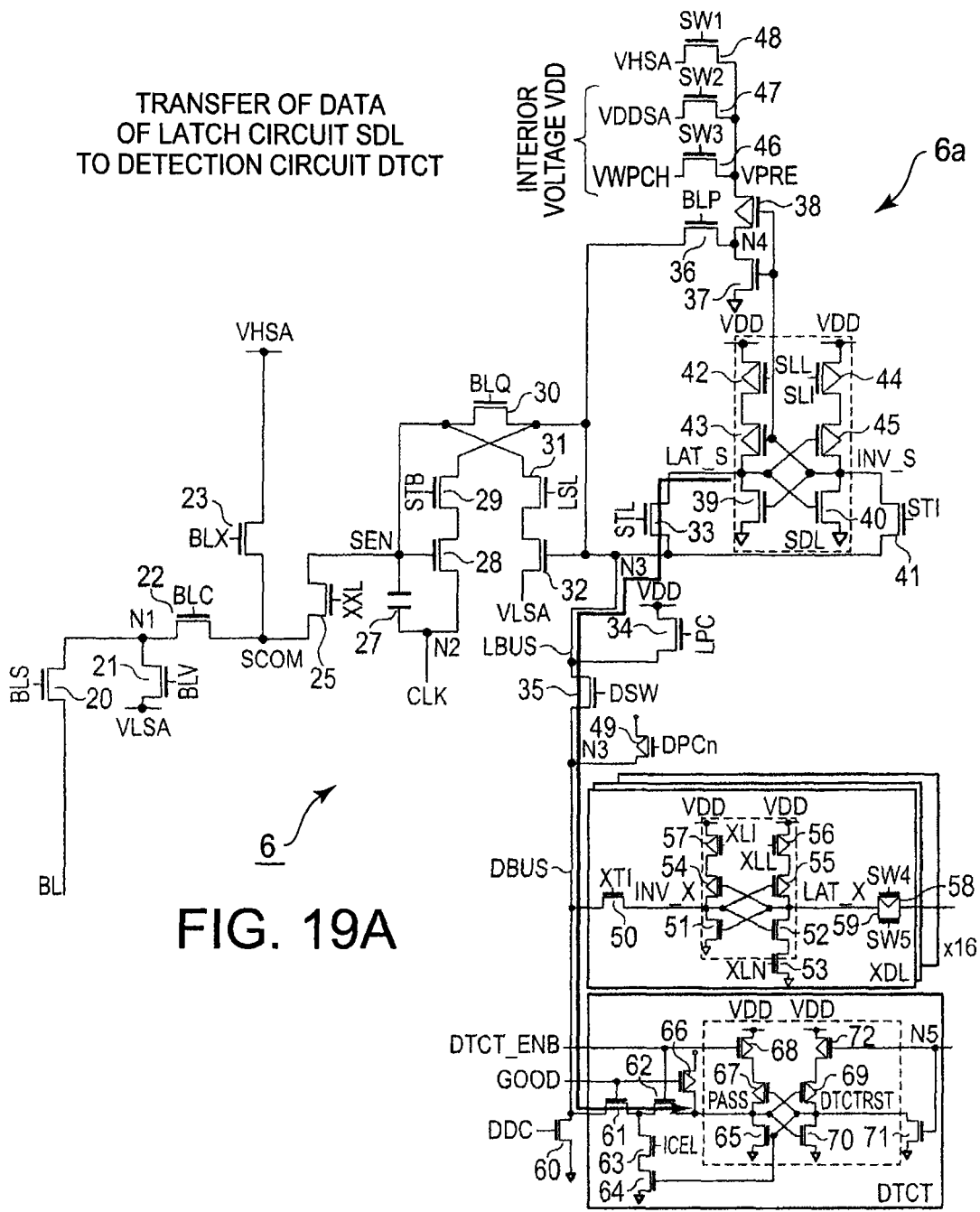

Then, as shown in FIG. 19A, the data held in the latch circuit SDL is transferred to the detection circuit DTCT. Specifically, the signals STL, DSW, DTCT_ENB are set to the level "H" to transfer the voltage level of the node LAT_X of the data latch circuit XDL to the node PASS in the detection circuit DTCT.

As shown in FIG. 19B, in the case where the bit line BL is not a bad column, the signal GOOD is at the level "H" so that the data held in the latch circuit SDL is transferred to the detection circuit DTCT.

8.4 <Transfer of 0 V or Voltage VWPCH to Bit Line BL>

Figures 20A, 20B:
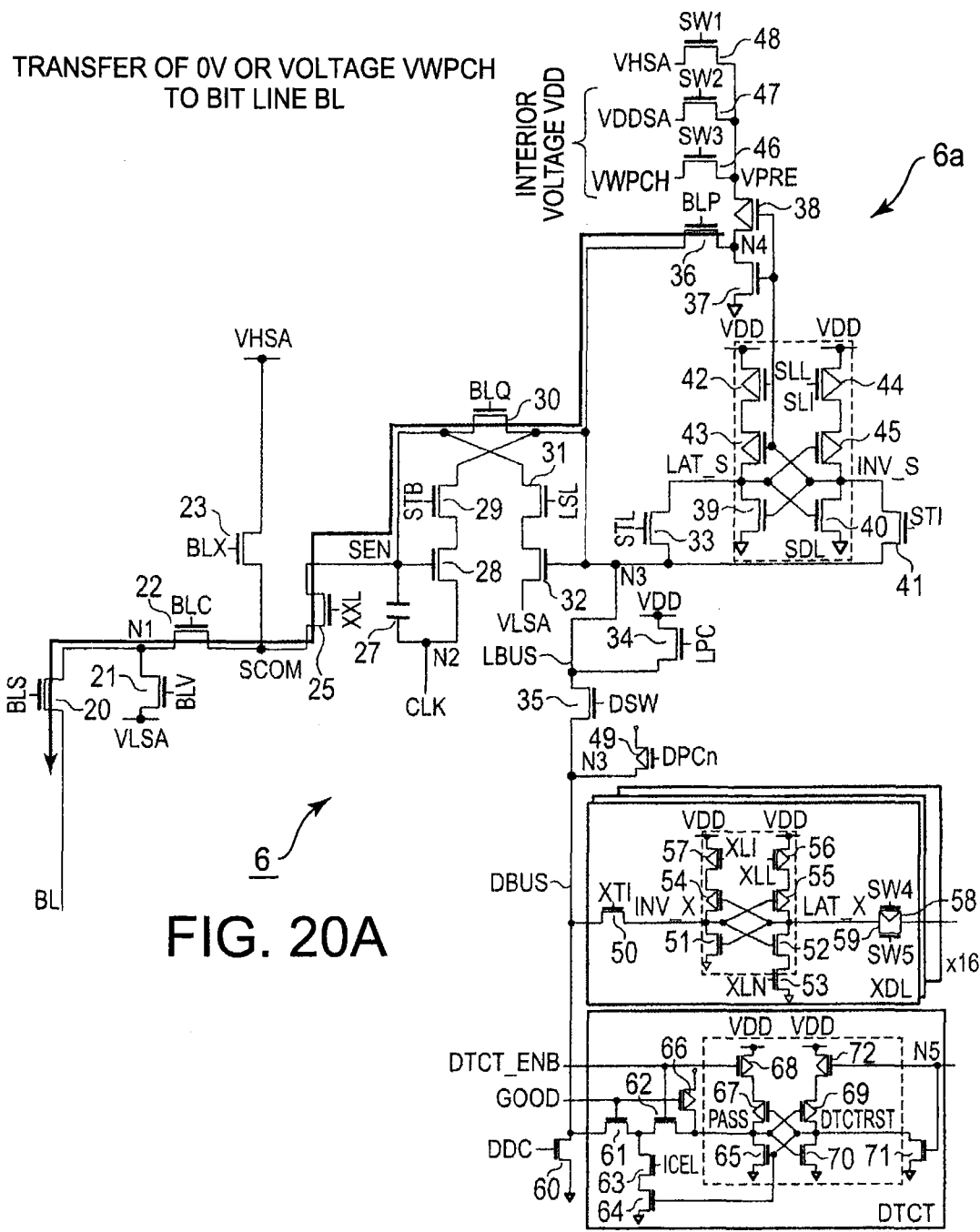

As shown in FIGS. 20A and 20B, 0 V or the voltage VWPCH is transferred to the bit line BL in accordance with the data held in the detection circuit DTCT. Specifically, the operations in FIGS. 12A to 15B are performed.

According to the modification described above, the reliability of operations can be maintained higher at a higher level than the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device, comprising:
   a memory cell array including non-volatile memory cells;
   bit lines electrically connected to the memory cells;
   word lines electrically connected to gates of the memory cells; and
   a sense amplifier circuit including sense amplifiers electrically connected to the bit lines, each of the sense amplifiers including a latch circuit which is capable of holding data, and a detection circuit, further the sense amplifiers being configured to apply any one of a first voltage and a second voltage higher than the first voltage to the bit lines respectively, wherein
   the sense amplifiers apply any one of the first voltage and the second voltage as a third voltage to the bit lines, and applies the third voltage to the detection circuit, and
   the sense amplifiers are capable of applying a fourth voltage higher than the second voltage to the bit lines, and apply the fourth voltage to the bit lines in a case where potentials of adjacent bit lines are the first voltage during writing operation.

2. The device according to claim 1, further comprising a pump circuit which generates the fourth voltage and a write voltage to be transferred to one selected from among the word lines, wherein
   the memory cell array includes a plurality of strings, and each of the strings includes ones of the memory cells and a select transistor, and
   in the write operation, a voltage for turning off the select transistor is provided to a gate of the select transistor before transferring a write voltage, and a voltage lower than the fourth voltage is transferred to the bit line.

3. The device according to claim 2, wherein each of the sense amplifiers includes a capacitor element connectable to the corresponding bit line, and the sense amplifier applies a fifth voltage to the capacitor element in accordance with an internal clock signal.

4. The device according to claim 3, wherein the bit lines include a first bit line and a second bit line, each of the sense amplifiers transfers any one of the third voltage and the fourth voltage corresponding to write data held in the latch circuit to the first bit line, and the sense amplifier transfers the first voltage to the second bit line.

5. The device according to claim 4, wherein the fourth voltage is transferred to the second bit line in a case where leakage current is not generated in the second bit line itself.

6. The device according to claim 1, wherein each of the sense amplifiers includes a capacitor element connectable to the corresponding bit line, and the sense amplifier supplies a fifth voltage to the capacitor element in accordance with an internal clock signal.

7. The device according to claim 1, further comprising a controller which outputs the control signal, wherein each of the sense amplifiers is controlled by the control signal output from the controller.

8. A non-volatile semiconductor memory device, comprising:
- a memory cell array including a plurality of non-volatile memory cells;
- a plurality of bit lines electrically connected to the memory cells;
- a plurality of word lines electrically connected to gates of the memory cells; and
- a sense amplifier circuit including a plurality of sense amplifiers electrically connected to the bit lines, each of the sense amplifiers including a latch circuit which is capable of holding data, and a detection circuit, further the sense amplifiers being configured to apply any one of a first voltage and a second voltage higher than the first voltage to the bit lines respectively, wherein
- the sense amplifier applies any one of the first voltage and the second voltage as a third voltage to the bit lines, and applies the third voltage to the detection circuit,
- the sense amplifiers are capable of transferring a fourth voltage higher than the second voltage to the bit lines and are configured to apply the fourth voltage to the bit lines in a case where potentials of adjacent bit lines are the first voltage during writing operation, and
- the bit lines include a first bit line and a second bit line, each of the sense amplifiers transfers any one of the third voltage and the fourth voltage corresponding to write data held in the latch circuit to the first bit line, and the sense amplifier transfers the first voltage to the second bit line.

9. The device according to claim 8, further comprising a pump circuit which generates the fourth voltage and a write voltage to be transferred to one selected from among the word lines, wherein
- the memory cell array includes a plurality of strings, and each of the strings includes ones of the memory cells and a select transistor, and
- in the write operation, a voltage for turning off the select transistor is provided to a gate of the select transistor before transferring a write voltage, and a voltage lower than the fourth voltage is transferred to the bit line.

10. The device according to claim 9, wherein each of the sense amplifiers includes a capacitor element connectable to the corresponding bit line, and the sense amplifier applies a fifth voltage to the capacitor element in accordance with an internal clock signal.

11. The device according to claim 8, wherein the fourth voltage is transferred to the second bit line in a case where leakage current is not generated in the second bit line itself.

12. The device according to claim 8, wherein each of the sense amplifiers includes a capacitor element connectable to the corresponding bit line, and the sense amplifier supplies a fifth voltage to the capacitor element in accordance with an internal clock signal.

13. The device according to claim 8, further comprising a controller which outputs the control signal, wherein each of the sense amplifiers is controlled by the control signal output from the controller.

14. A method of controlling a non-volatile semiconductor memory device, the device including a memory cell array including non-volatile memory cells, bit lines electrically connected to the memory cells, word lines electrically connected to gates of the memory cells, and a sense amplifier circuit including sense amplifiers electrically connected to the bit lines, each of the sense amplifiers including a latch circuit which is capable of holding data, and a detection circuit, the sense amplifiers being configured to apply any one of a first voltage and a second voltage higher than the first voltage to the bit lines respectively, comprising:
- applying a verify voltage to each of the word lines while applying a fourth voltage higher than the second voltage to each of the bit lines from each of the sense amplifiers; and
- after applying the verify voltage, applying the third voltage to the detection circuit while applying any one of the first voltage and the second voltage as a third voltage to each of the bit lines from the sense amplifier.

* * * * *